(12) United States Patent
Aikawa

(10) Patent No.: US 8,994,367 B2
(45) Date of Patent: Mar. 31, 2015

(54) DIFFERENTIAL TRANSFORMER TYPE MAGNETIC SENSOR

(71) Applicant: Kyocera Document Solutions Inc., Osaka-shi, Osaka (JP)

(72) Inventor: Yukihiro Aikawa, Osaka (JP)

(73) Assignee: Kyocera Document Solutions, Osaka (JP)

( * ) Notice: Subject to any disclaimer, the term of this patent is extended or adjusted under 35 U.S.C. 154(b) by 329 days.

(21) Appl. No.: 13/652,697

(22) Filed: Oct. 16, 2012

(65) Prior Publication Data

US 2013/0099778 A1   Apr. 25, 2013

(30) Foreign Application Priority Data

Oct. 20, 2011 (JP) ................................. 2011-230311
Oct. 20, 2011 (JP) ................................. 2011-230312
Oct. 1, 2012 (JP) ................................. 2012-219338
Oct. 1, 2012 (JP) ................................. 2012-219339

(51) Int. Cl.
*G01B 7/14* (2006.01)
*G01R 33/028* (2006.01)
*G01R 33/04* (2006.01)

(52) U.S. Cl.
CPC .............. *G01R 33/028* (2013.01); *G01R 33/04* (2013.01)
USPC ............ 324/207.17; 324/207.16; 324/207.18; 324/207.19; 324/207.22

(58) Field of Classification Search
USPC ............... 324/207.11–207.26, 225, 244, 249, 324/252, 260, 262
See application file for complete search history.

(56) References Cited

U.S. PATENT DOCUMENTS

| | | | | |
|---|---|---|---|---|
| 5,767,670 A | * | 6/1998 | Maher et al. | 324/207.12 |
| 6,429,651 B1 | * | 8/2002 | Choi et al. | 324/249 |
| 7,132,812 B1 | * | 11/2006 | Wu et al. | 318/448 |
| 2002/0097042 A1 | * | 7/2002 | Kawate et al. | 324/207.17 |
| 2004/0124833 A1 | * | 7/2004 | Kliman et al. | 324/241 |

FOREIGN PATENT DOCUMENTS

| | | | |
|---|---|---|---|
| JP | 10-104934 | | 4/1998 |
| JP | 2000-131406 | | 5/2000 |
| JP | 2000131406 A | * | 5/2000 |
| JP | 2000347495 A | * | 12/2000 |
| JP | 2001-99654 | | 4/2001 |
| JP | 2001099654 A | * | 4/2001 |

(Continued)

*Primary Examiner* — Huy Q Phan
*Assistant Examiner* — David Frederiksen
(74) *Attorney, Agent, or Firm* — Gerald E. Hespos; Michael J. Porco; Matthew T. Hespos

(57) ABSTRACT

A differential transformer type magnetic sensor is disclosed. The drive coil includes a planar coil arranged on a substrate. The first differential coil includes a planar coil arranged on the substrate. The second differential coil includes a planar coil arranged on the substrate and connected to the first differential coil. The first selector unit is used for a zero adjustment of a differential transformer. The first differential coil includes a plurality of first branch lines formed by branching a wire material forming the outermost turn of the first differential coil. The plurality of first branch lines are so arranged that the amount of magnetic fluxes passing along the plurality of respective first branch lines differ when the drive coil is driven. The first selector unit is capable of selecting any one of the plurality of first branch lines and arranged on the substrate.

13 Claims, 15 Drawing Sheets

(56) References Cited

FOREIGN PATENT DOCUMENTS

| JP | 2001-165910 | 6/2001 |
|---|---|---|
| JP | 2002-296239 | 10/2002 |
| JP | 2002-296890 | 10/2002 |
| JP | 2006-106009 | 4/2006 |
| JP | 2007-24553 | 2/2007 |

* cited by examiner

DIFFERENTIAL TRANSFORMER TYPE MAGNETIC SENSOR

This application is based on Japanese Patent Application Serial No. 2011-230311 filed with the Japan Patent Office on Oct. 20, 2011, Japanese Patent Application Serial No. 2011-230312 filed with the Japan Patent Office on Oct. 20, 2011, Japanese Patent Application Serial No. 2012-219338 filed with the Japan Patent Office on Oct. 1, 2012 and Japanese Patent Application Serial No. 2012-219339 filed with the Japan Patent Office on Oct. 1, 2012, the contents of which are hereby incorporated by reference.

BACKGROUND

The present disclosure relates to a differential transformer type magnetic sensor using planar coils.

In an image forming apparatus using a toner as a developer, a magnetic sensor is used to detect the remaining amount and density of the toner. There are various types of magnetic sensors. A differential transformer type magnetic sensor is so configured that a drive coil, a differential coil which functions as a detection coil and a differential coil which functions as a reference coil are arranged on the same core.

A differential transformer type magnetic sensor in which a first coil (drive coil), a second coil (differential coil), a third coil (differential coil) and a fourth coil (drive coil) are respectively arranged on first, second, third and fourth layers and insulating substrates are arranged between the respective layers has been proposed as an example.

A differential transformer type magnetic sensor in which a first coil (drive coil) and a third coil (differential coil) are arranged side by side on one surface of an insulating magnetic substrate and a second coil (drive coil) and a fourth coil (differential coil) are arranged side by side on the other surface of the insulating magnetic substrate has been proposed as another example.

Since the first to fourth coils are arranged one over another via the substrates in the one example of the differential transformer type magnetic sensor, a distance between the first coil (drive coil) and the second coil (differential coil) and that between the third coil (differential coil) and the fourth coil (drive coil) can be approximated to each other. Thus, magnetic coupling between the first and second coils and that between the third and fourth coils can be increased. Therefore, a highly accurate magnetic sensor can be realized. However, four layers of substrates are necessary, which constitutes an obstacle to the miniaturization of the magnetic sensor and increases the production cost of the magnetic sensor.

Since two layers (both surfaces) of substrates are used in the other example of the differential transformer type magnetic sensor, the production cost of the magnetic sensor can be reduced. However, the first coil (drive coil) and the third coil (differential coil) are arranged side by side on the one surface of the substrate and the second coil (drive coil) and the fourth coil (differential coil) are arranged side by side on the other side of the substrate. The first and third coils are not facing each other, and the second and fourth coils are not facing each other. Thus, magnetic coupling between the first and third coils and that between the second and fourth coils cannot be increased. Therefore, a highly accurate magnetic sensor cannot be realized.

Further, a differential transformer type magnetic sensor necessitates a zero adjustment, i.e. an adjustment to balance between an electromotive force generated in one differential coil (detection coil) and that generated in the other differential coil (reference coil). The zero adjustment can be made by providing the magnetic sensor with a mechanism for adjusting the position of a core of a differential transformer and by adjusting the position of the core. However, in the case of a differential transformer using planar coils patterned on a printed circuit board as a drive coil and differential coils, it is difficult to provide the above mechanism on the printed circuit board.

An object of the present disclosure is to provide a highly accurate differential transformer type magnetic sensor while realizing a configuration using planar coils arranged on a substrate as a drive coil and differential coils.

SUMMARY

A differential transformer type magnetic sensor according to one aspect of the present disclosure includes a substrate, a drive coil, a first differential coil, a second differential coil and a first selector unit. The drive coil includes a planar coil arranged on the substrate. The first differential coil includes a planar coil arranged on the substrate and generates an electromotive force when the drive coil is driven. The second differential coil includes a planar coil arranged on the substrate and is connected to the first differential coil and configured to generate an electromotive force when the drive coil is driven. The first selector unit is used for a zero adjustment of a differential transformer formed by the drive coil, the first differential coil and the second differential coil. The first differential coil includes a plurality of first branch lines formed by branching a wire material forming the outermost turn of the first differential coil. The plurality of first branch lines are so arranged that the amount of magnetic fluxes passing along the plurality of respective first branch lines differ when the drive coil is driven. The first selector unit is capable of selecting any one of the plurality of first branch lines and arranged on the substrate.

A differential transformer type magnetic sensor according to another aspect of the present disclosure includes a substrate, a drive coil, a first differential coil and a second differential coil. The drive coil includes a planar coil arranged on the substrate. The first differential coil includes a planar coil arranged on the substrate and generates an electromotive force when the drive coil is driven. The second differential coil includes a planar coil arranged on the substrate and is connected to the first differential coil and configured to generate an electromotive force when the drive coil is driven. The amount of magnetic flux passing along the wire material forming the outermost turn of the first differential coil and the amount of magnetic flux passing along the wire material forming the outermost turn of the second differential coil differ when the drive coil is driven.

A differential transformer type magnetic sensor according to still another aspect of the present disclosure includes a substrate, a first drive coil, a first differential coil, a second drive coil, a first connecting member, a second differential coil, a second connecting member, a third connecting member and a connection pattern. The substrate has a first surface and a second surface located on a side opposite to the first surface. The first drive coil includes a planar coil arranged on the first surface. The first differential coil includes a planar coil wound in the same direction as the first drive coil and arranged on the first surface and generates an electromotive force when the first drive coil is driven. The second drive coil includes a planar coil wound in a direction opposite to the first drive coil when viewed from the first surface side and arranged on the second surface. The first connecting member penetrates through the substrate and connects one end of the first drive coil and one end of the second drive coil. The second differential coil includes a planar coil wound in a direction opposite to the second drive coil and arranged on the second surface and generates an electromotive force when the second drive coil is driven. The second connecting member penetrates through the substrate and connects one end of the first differential coil and one end of the second differential coil. The third connecting member is formed to penetrate through the substrate. The connection pattern is arranged on the first surface and constitutes a part of the second drive coil or a part of the second differential coil. A wire material forming the first drive coil and that forming the first differential coil are alternately arranged on the first surface. A wire material forming the second drive coil and that forming the second differential coil are alternately arranged on the second surface. The connection pattern is connected to the wire material forming the second drive coil or that forming the second differential coil by the third connecting member, whereby the wire material forming the second differential coil and that forming the second drive coil are sterically intersected.

These and other objects, features and advantages of the present disclosure will become more apparent upon reading the following detailed description along with the accompanying drawings.

DETAILED DESCRIPTION

Figure 1:
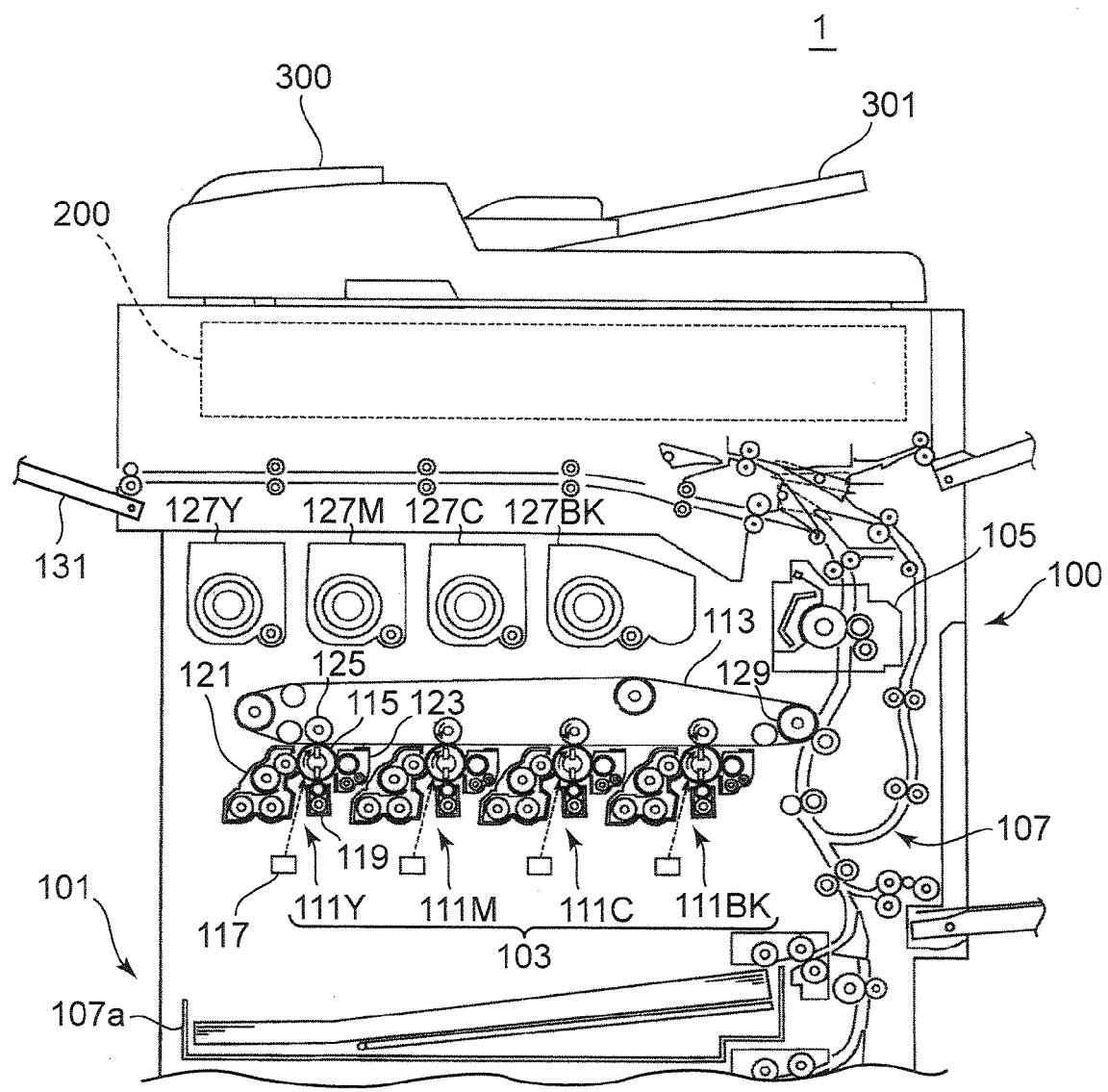
FIG. 1 is a schematic diagram showing the internal structure of an image forming apparatus to which a differential transformer type magnetic sensor according to one embodiment of the present disclosure can be applied.

Hereinafter, an embodiment of the present disclosure is described in detail based on the drawings. FIG. 1 is a schematic diagram showing the internal structure of an image forming apparatus 1 to which a differential transformer type magnetic sensor according to one embodiment of the present disclosure can be applied. The image forming apparatus 1 can be applied, for example, to a digital complex machine with functions of a copier, a printer, a scanner and a facsimile machine. The image forming apparatus 1 includes an apparatus main body 100, a document reading unit 200 and a document feeding unit 300.

The document reading unit 200 is arranged atop the apparatus main body 100 and the document feeding unit 300 is arranged atop the document reading unit 200.

The document feeding unit 300 functions as an automatic document feeder and is capable of successively feeding a plurality of documents placed on a document placing portion 301 to the document reading unit 200.

The document reading unit 200 includes a carriage carrying an exposure lamp and the like, a document platen made of a transparent member such as a glass, a CCD (Charge Coupled Device) sensor and document reading slits (any of them is not shown). The CCD sensor outputs information of a read document as image data.

The apparatus main body 100 includes a sheet storage unit 101, an image forming station 103 and a fixing unit 105. The sheet storage unit 101 is arranged in a lowest part of the apparatus main body 100 and includes a plurality of sheet cassettes capable of storing a stack of sheets. Only the uppermost sheet cassette 107a is shown in FIG. 1.

The uppermost sheet in the sheet stack stored in the cassette selected out of a plurality of sheet cassettes including the sheet cassette 107a is fed toward a sheet conveyance path 107 of the apparatus main body 100 by driving a pickup roller (not shown). The sheet is conveyed to the image forming station 103 through the sheet conveyance path 107.

The sheet conveyance path 107 extends upward substantially in a vertical direction along one side surface (right side surface in FIG. 1) of the apparatus main body 100 and is curved to extend substantially in a horizontal direction along and below the document reading unit 200 toward the other side surface (left side surface in FIG. 1) in an upper part. A discharge tray 131 is provided at an end part of the sheet conveyance path 107.

The image forming station 103 forms a toner image on a sheet conveyed thereto. The image forming station 103 includes a yellow image forming unit 111Y, a magenta image forming unit 111M, a cyan image forming unit 111C and a black image forming unit 111BK arranged in accordance with an order of transferring a toner image to a transfer belt 113. These units have a similar configuration and are, hence, described, taking the yellow image forming unit 111Y as an example.

The yellow image forming unit 111Y includes a photoconductive drum 115 and an exposure device 117. A charging device 119, a developing device 121 and a cleaning device 123 are arranged around the photoconductive drum 115. A two-component developer which is mixed by yellow toners and carriers is contained in the developing device 121. The charging device 119 uniformly charges the circumferential surface of the photoconductive drum 115. The exposure device 117 generates a beam modulated to correspond to image data (image data output from the document reading unit 200, image data transmitted from a personal computer, facsimile-received image data or the like) and irradiates the generated beam to the uniformly charged circumferential surface of the photoconductive drum 115. This causes an electrostatic latent image corresponding to yellow image data to be formed on the circumferential surface of the photoconductive drum 115. By supplying a yellow toner from the developing device 121 to the circumferential surface of the photoconductive drum 115 in this state, a toner image corresponding to the yellow image data is formed on the circumferential surface.

The transfer belt 113 can move counterclockwise while being sandwiched between the photoconductive drum 115 and a primary transfer roller 125. The yellow toner image is transferred from the photoconductive drum 115 to the transfer belt 113. The yellow toner remaining on the circumferential surface of the photoconductive drum 115 is removed by the cleaning device 123. The above is the description of the yellow image forming unit 111Y.

Containers containing toners of corresponding colors, i.e. a yellow toner container 127Y, a magenta toner container 127M, a cyan toner container 127C and a black toner container 127BK are arranged above the yellow image forming unit 111Y, the magenta image forming unit 111M, the cyan image forming unit 111C and the black image forming unit 111BK. The toners are supplied to the developing devices 121 of the respective colors from the corresponding containers.

As described above, a yellow toner image is transferred to the transfer belt 113, a magenta toner image is transferred onto this toner image, and a cyan toner image and a black toner image are similarly transferred in a superimposition manner. This causes a full-color toner image to be formed on the transfer belt 113. By transferring the toner images of the respective color patterns in a superimposition manner in this way, the full-color toner image is formed on the transfer belt 113. The full-color toner image is transferred to a sheet conveyed from the sheet storage unit 101 described above by a secondary transfer roller 129.

The sheet having the color toner image transferred thereto is fed to the fixing unit 105. The fixing unit 105 includes a heating roller and a fixing roller. The sheet having the full-color toner image transferred thereto is sandwiched by these rollers. This causes heat and pressure to be applied to the full-color toner image and the sheet to fix the full-color toner image to the sheet. The sheet is discharged to the discharge tray 131.

Figure 2:
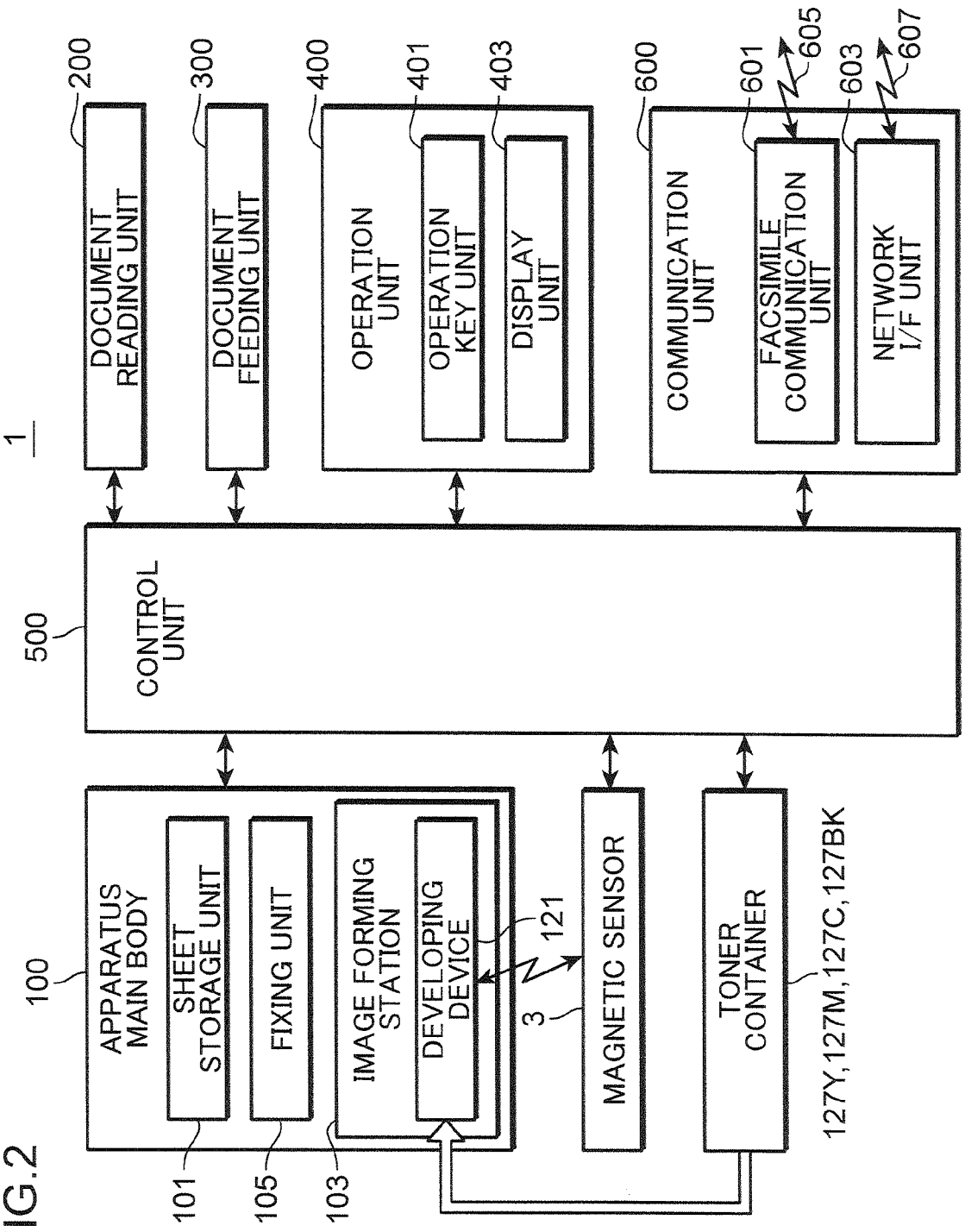
FIG. 2 is a block diagram showing the configuration of the image forming apparatus shown in FIG. 1.

FIG. 2 is a block diagram showing the configuration of the image forming apparatus 1 shown in FIG. 1. The image forming apparatus 1 is so configured that the apparatus main body 100, a differential transformer type magnetic sensor 3, the toner containers 127Y, 127M, 127C and 127BK, the document reading unit 200, the document feeding unit 300, an operation unit 400, a control unit 500 and a communication unit 600 are connected to each other by a bus. Since the apparatus main body 100, the toner containers 127Y, 127M, 127C and 127BK, the document reading unit 200 and the document feeding unit 300 are already described, they are not described.

The differential transformer type magnetic sensor 3 is used to measure a toner/carrier mixing ratio in the developing device 121. That is, in a two-component development method, the ratio of the carrier (magnetic substance) increases in the developing device 121 as the toner (nonmagnetic substance) decreases. This causes an increase in the amount of the magnetic substance in a unit volume near a detection surface of the differential transformer type magnetic sensor 3. On the other hand, in the developing device 121, the ratio of the carrier decreases when the toner increases. This causes a decrease in the amount of the magnetic substance in a unit volume near the detection surface of the differential transformer type magnetic sensor 3. By detecting this change in the amount of the magnetic substance by the differential transformer type magnetic sensor 3, the toner/carrier mixing ratio in the developing device 121 is controlled. The differential transformer type magnetic sensor 3 is described in detail later.

Note that although the two-component development method is described in this embodiment, the differential transformer type magnetic sensor 3 is usable also in a one-component development method using a toner containing a magnetic substance. In this case, the remaining amount of the magnetic toner in the developing device or the toner container is measured by mounting the differential transformer type magnetic sensor 3 in the developing device or the toner container.

The operation unit 400 includes an operation key unit 401 and a display unit 403. The display unit 403 has a touch panel function and displays a screen including soft keys. A user performs settings necessary to perform functions such as a copy function by operating the soft keys while viewing the screen.

The operation unit 401 includes operation keys composed of hard keys. Specifically, a start key, a numerical keypad, a stop key, a reset key, function changeover keys to switch copy, printer, scanner and facsimile machine functions and the like are provided.

The start key is a key for starting an operation such as a copying operation or facsimile transmission. The numerical keypad includes keys used to input a number such as the number of sets to be copied or a facsimile number. The stop key is a key for stopping a copying operation or the like halfway. The reset key is a key for returning a set content to a default state.

The function changeover keys include a copy key, a transmit key and the like and switch a copy function, a transmit function and the like from one to another. If the copy key is operated, an initial screen for copy is displayed on the display unit 403. If the transmit key is operated, an initial screen for facsimile transmission and mail transmission is displayed on the display unit 403.

The control unit 500 includes a CPU (Central Processing Unit), a ROM (Read Only Memory), a RAM (Random Access Memory), an image memory and the like. The CPU performs a control necessary to operate the image forming apparatus 1 on the above constituent elements of the image forming apparatus such as the apparatus main body 100. The ROM stores software necessary to control the operation of the image forming apparatus 1. The RAM is used to temporarily store data generated when the software is implemented and store application software and the like. The image memory temporarily stores image data (image data output from the document reading unit 200, image data transmitted from a personal computer, facsimile-received image data or the like).

The communication unit 600 includes a facsimile communication unit 601 and a network I/F unit 603. The facsimile communication unit 601 includes an NCU (Network Control Unit) for controlling a telephone line connection to a destination facsimile machine and a modulation/demodulation circuit for modulating and demodulating a signal for facsimile communication. The facsimile communication unit 601 is connected to a telephone line 605.

The network I/F unit 603 is connected to a LAN (Local Area Network) 607. The network I/F unit 603 is a communication interface circuit for carrying out a communication with terminal units such as personal computers connected to the LAN 607.

Figure 3:
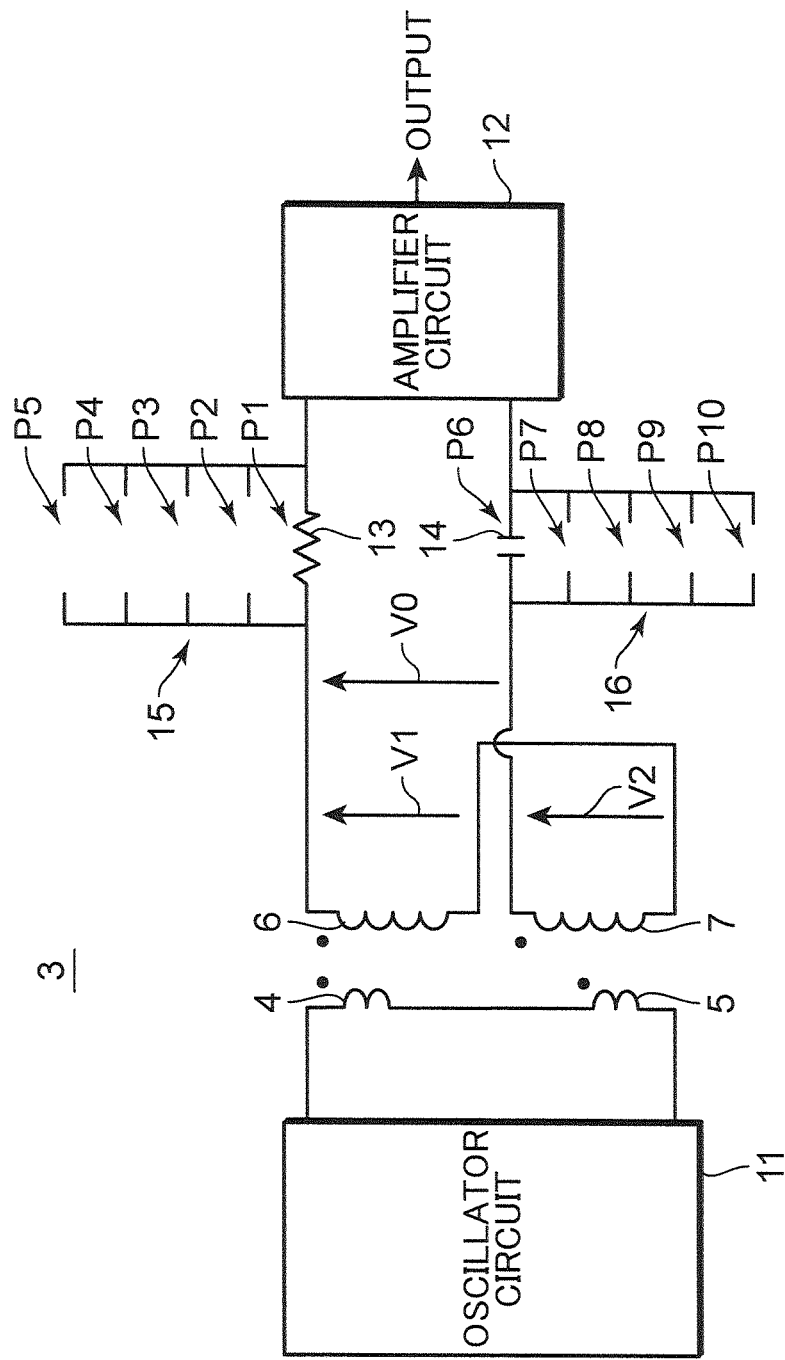
FIG. 3 is a diagram showing an example of a circuit diagram of the differential transformer type magnetic sensor according to the embodiment.

FIG. 3 is a diagram showing an example of a circuit diagram of the differential transformer type magnetic sensor 3 (hereinafter, may be written as "magnetic sensor 3" in some cases) according to one embodiment of the present disclosure. The differential transformer type magnetic sensor 3 includes a first drive coil 4, a second drive coil 5, a first differential coil 6, a second differential coil 7, an oscillator circuit 11, an amplifier circuit 12, a resistor 13 and a capacitor 14.

The oscillator circuit 11 generates a high-frequency current for driving the first and second drive coils 4, 5. The first and second drive coils 4, 5 are connected in series. One end of the first drive coil 4 and one end of the second drive coil are so connected that a magnetic flux generated by the first drive coil 4 and that generated by the second drive coil 5 flow in the same direction when a high-frequency current flows in the first and second drive coils 4, 5. This prevents the magnetic flux generated by the first drive coil 4 and that generated by the second drive coil 5 from being canceled out. The other end of the first drive coil 4 and the other end of the second drive coil 5 are connected to the oscillator circuit 11.

The first differential coil 6 is magnetically coupled to the first drive coil 4. The second differential coil 7 is magnetically coupled to the second drive coil 5. The first and second differential coils 6, 7 are connected in series. One end of the first differential coil 6 and one end of the second differential coil 7 are so connected that a magnetic flux generated by the first differential coil 6 and that generated by the second differential coil 7 flow in opposite directions when an induction current flows in the first differential coil 6 and the second differential coil 7. This causes a differential voltage V0 (=electromotive force V1 of the first differential coil 6−electromotive force V2 of the second differential coil 7) to be input to the amplifier circuit 12.

The other end of the first differential coil 6 is connected to the amplifier circuit 12 via the resistor 13 and the other end of the second differential coil 7 is connected thereto via the capacitor 14. The resistor 13 is connected to a base of a bipolar transistor (not shown) in the amplifier circuit 12 and used to set an amplification factor of the amplifier circuit 12.

The capacitor 14 has a function of cutting a direct-current component out of the differential voltage V0. This causes only an alternating-current component of the differential voltage V0 to be input to the amplifier circuit 12.

The resistor 13 is mounted at any one of positions P1 to P5. The capacitor 14 is mounted at any one of positions P6 to P10. A part for adjusting the mounted position of the resistor 13 is called a first selector unit 15. A part for adjusting the mounted position of the capacitor 14 is called a second selector unit 16. A zero adjustment of a differential transformer of the magnetic sensor 3 is made by adjusting the mounted position of the resistor 13 and the mounted position of the capacitor 14. This is described later. The differential transformer is formed by the first drive coil 4, the second drive coil 5, the first differential coil 6 and the second differential coil 7.

The operation of the magnetic sensor 3 is briefly described. When a high-frequency current generated in the oscillator circuit 11 flows into the first and second drive coils 4, 5, an electromotive force V1 is generated in the first differential coil 6 and an electromotive force V2 is generated in the second differential coil 7. The first differential coil 6 has a function of a reference coil and the second differential coil 7 has a function of a detection coil. If the ratio of the magnetic substance (carrier) increases near the second differential coil 7, the electromotive force V2 becomes larger than the electromotive force V1, wherefore the differential voltage V0 does not become 0V. The differential voltage V0 is amplified in the amplifier circuit 12 and a toner/carrier mixing ratio (toner remaining amount in the one-component development method) is detected using a signal output from the amplifier circuit 12.

Figure 4:
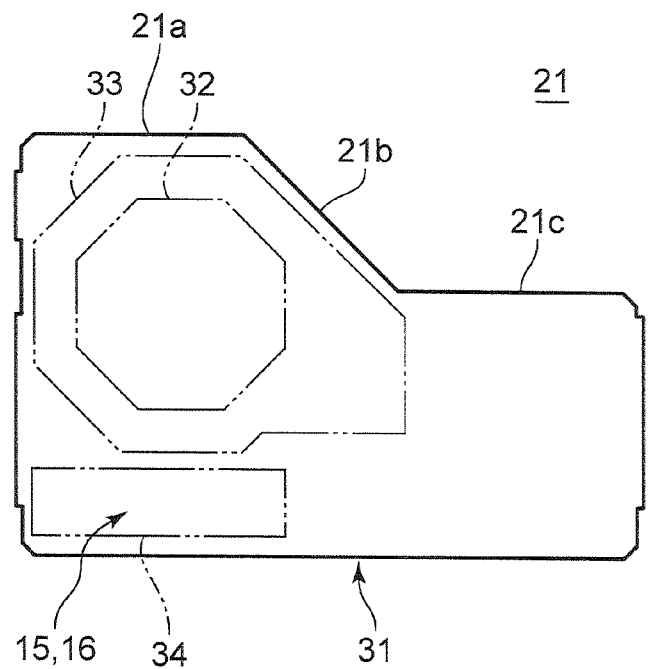
FIG. 4 is a plan view showing a first surface of an example of a substrate on which the differential transformer type magnetic sensor according to the embodiment is to be formed.
Figure 5:
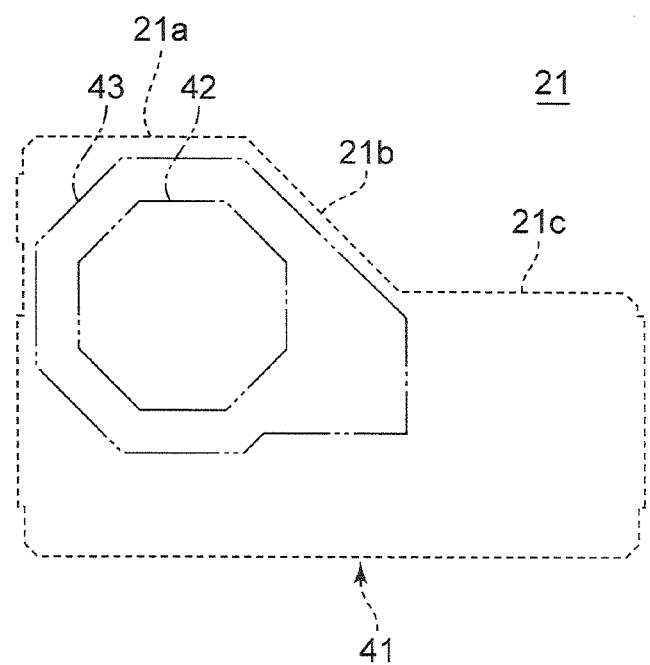
FIG. 5 is a plan view showing a second surface of the example of the substrate on which the differential transformer type magnetic sensor according to the embodiment is to be formed.

Next, the configuration of the differential transformer type magnetic sensor 3 according to this embodiment is described in detail. FIG. 4 is a plan view showing a first surface 31 of an example of a substrate 21 on which the magnetic sensor 3 is to be formed. FIG. 5 is a plan view showing a second surface 41 of the example of the substrate 21 on which the magnetic sensor 3 is to be formed. FIG. 5 shows a state when the second surface 41 is viewed through the substrate 21 from the first surface 31 side. The substrate 21 is an insulating single-layer printed circuit board and has the first surface 31 and the second surface 41 located on a side opposite to the first surface 31.

The substrate 21 has a shape obtained by cutting off a part including one corner of a rectangle from the rectangle. The substrate 21 is divided into a part 21a having a constant vertical dimension, a part 21b continuous with the part 21a and having a gradually decreasing vertical dimension and a part 21c having a constant vertical dimension. Coils and the like of the magnetic sensor 3 are arranged on the parts 21a, 21b as described next. Various circuits (oscillator circuit 22, amplifier circuit 12, etc.) of the magnetic sensor 3 are arranged on the part 21c.

With reference to FIGS. 3 and 4, the first surface 31 has a first inner area 32, a first outer area 33 and a selector unit area 34. These areas are located on the parts 21a, 21b of the substrate 21. The first differential coil 6 is arranged in the first inner area 32. The first outer area 33 surrounds the first inner area 32. The first differential coil 6 and the first drive coil 4 are arranged in the first outer area 33. The selector unit area 34 is adjacent to a part of the first outer area 33. The first and second selector units 15, 16 for adjusting a zero point of the differential transformer of the magnetic sensor 3 are arranged in the selector unit area 34.

With reference to FIGS. 3 and 5, the second surface 41 has a second inner area 42 and a second outer area 43. These areas are located on the parts 21a, 21b of the substrate 21. The second differential coil 7 is arranged in the second inner area 42. The second outer area 43 surrounds the second inner area 42. The second differential coil 7 and the second drive coil 5 are arranged in the second outer area 43.

Figure 6:
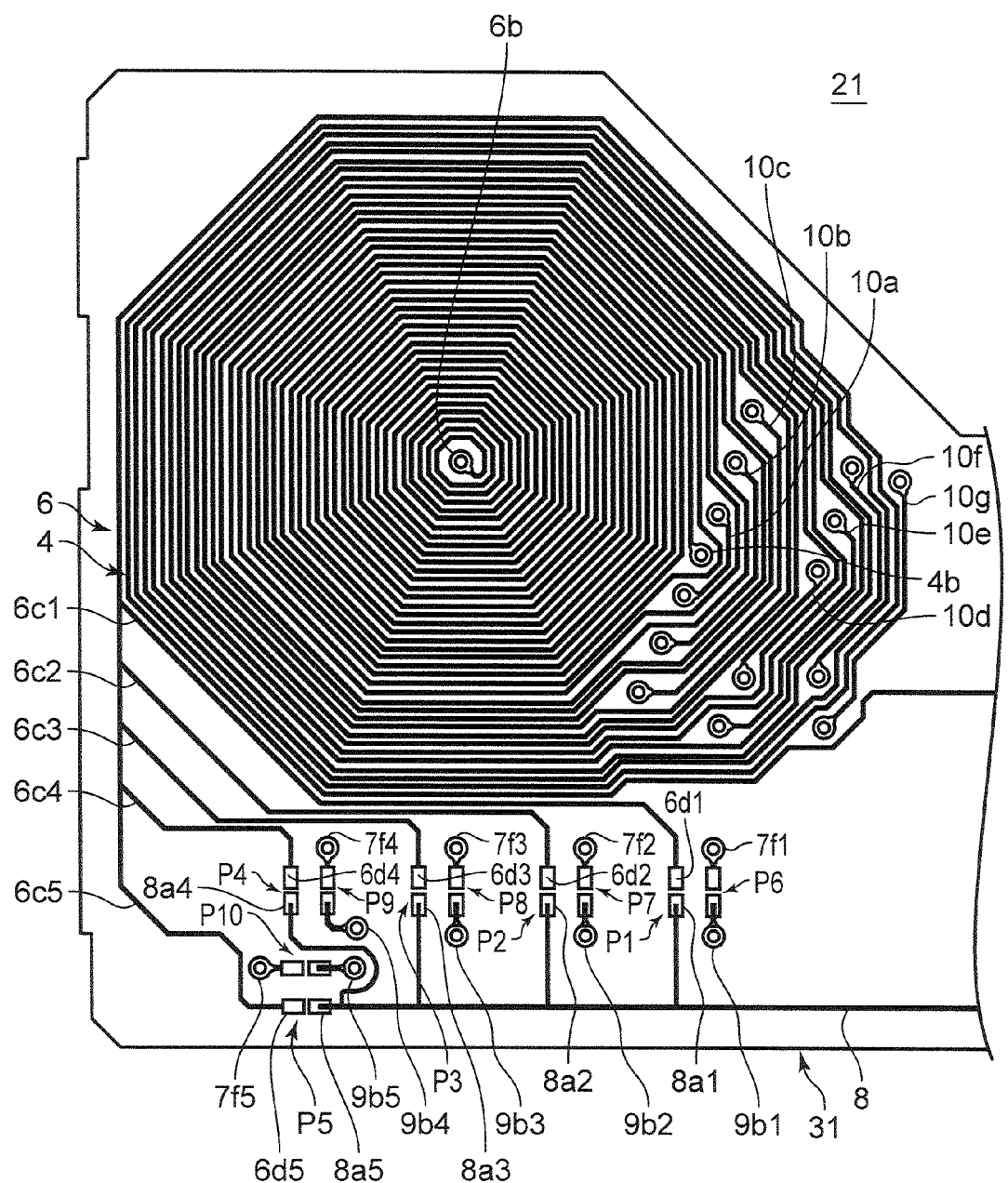
FIG. 6 is a plan view showing a layout example of a first drive coil, a first differential coil and connection patterns.

FIG. 6 is a plan view showing a layout example of the first drive coil 4, the first differential coil 6 and connection patterns 10a, 10b, 10c, 10d, 10e, 10f and 10g. The first drive coil 4, the first differential coil 6 and the connection patterns 10a to 10g are arranged on the first surface 31 of the substrate 21. Since the first differential coil 6 functions as the reference coil, the first surface 31 can be called a reference coil surface.

Figure 7:
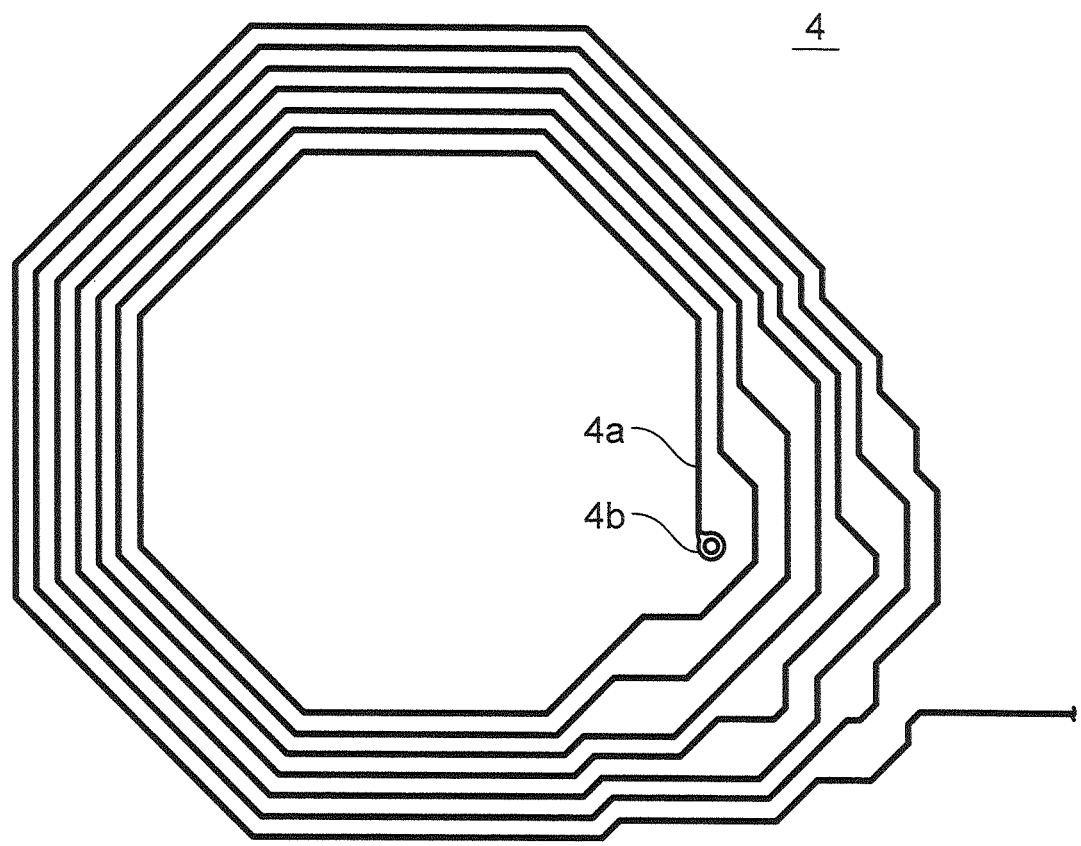
FIG. 7 is a plan view showing a state where the first drive coil is extracted from the first drive coil, the first differential coil and the connection patterns shown in FIG. 6.

First, the first drive coil 4 is described. FIG. 7 is a plan view showing a state where the first drive coil 4 is extracted from the first drive coil 4, the first differential coil 6 and the connection patterns 10a to 10g shown in FIG. 6. With reference to FIGS. 4 and 7, the first drive coil 4 includes a planar coil arranged in the first outer area 33. Specifically, the first drive coil 4 is made of a wire material 4a wound in an octagonal shape, and the wire member 4a is so patterned that the octagonal shape becomes gradually larger in a counterclockwise direction from a terminal 4b as a start end.

Figure 8:
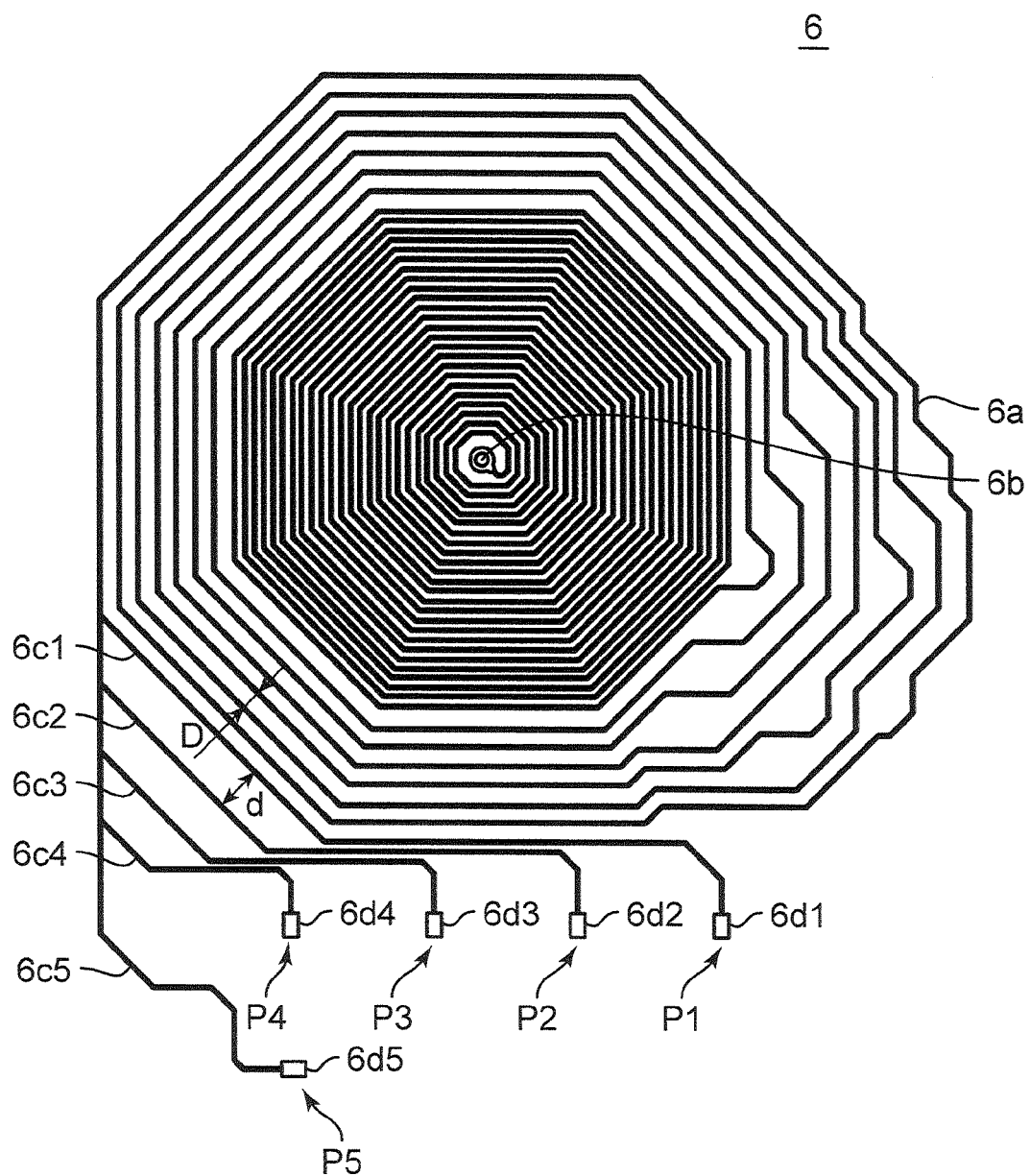
FIG. 8 is a plan view showing a state where the first differential coil is extracted from the first drive coil, the first differential coil and the connection patterns shown in FIG. 6.

Next, the first differential coil 6 is described. FIG. 8 is a plan view showing a state where the first differential coil 6 is extracted from the first drive coil 4, the first differential coil 6 and the connection patterns 10a to 10g shown in FIG. 6. With reference to FIGS. 4 and 8, the first differential coil 6 includes a planar coil wound in the same direction as the first drive coil 4 and arranged in the first inner area 32 and the first outer area 33. Specifically, the first differential coil 6 is made of a wire material 6a wound in an octagonal shape, and the wire member 6a is so patterned that the octagonal shape becomes gradually larger in the counterclockwise direction from a terminal 6b as a start end.

With reference to FIGS. 4 and 6, the wire member forming the first differential coil 6 and that forming the first drive coil 4 are alternately arranged in the first outer area 33. The first differential coil 6 includes five (an example of plural) first branch lines 6c1, 6c2, 6c3, 6c4 and 6c5 formed by branching the wire member forming the outermost turn of the first drive coil 6. The first branch lines 6c1 to 6c5 are written as first branch lines 6c in some cases unless it is necessary to distinguish the first branch lines 6c1 to 6c5. The five first branch lines 6c are so arranged that the amounts of magnetic fluxes passing along the respective first branch lines 6c differ when the first drive coil is driven. The first branch lines 6c are described in detail later.

Figure 9:
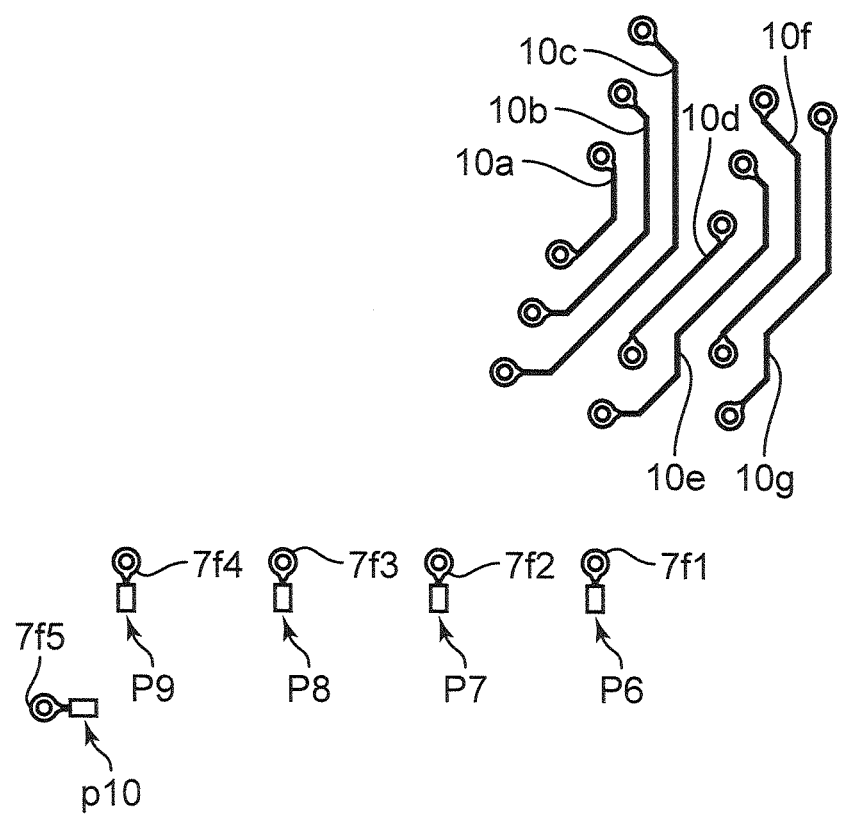
FIG. 9 is a plan view showing a state where the connection patterns are extracted from the first drive coil, the first differential coil and the connection patterns shown in FIG. 6.

FIG. 9 is a plan view showing a state where the connection patterns 10a to 10g are extracted from the first drive coil 4, the first differential coil 6 and the connection patterns 10a to 10g shown in FIG. 6. The connection patterns 10a to 10g are used for connection with the wire material forming the second differential coil 7. The connection patterns 10a to 10g are described later together with the second differential coil 7.

Figure 10:
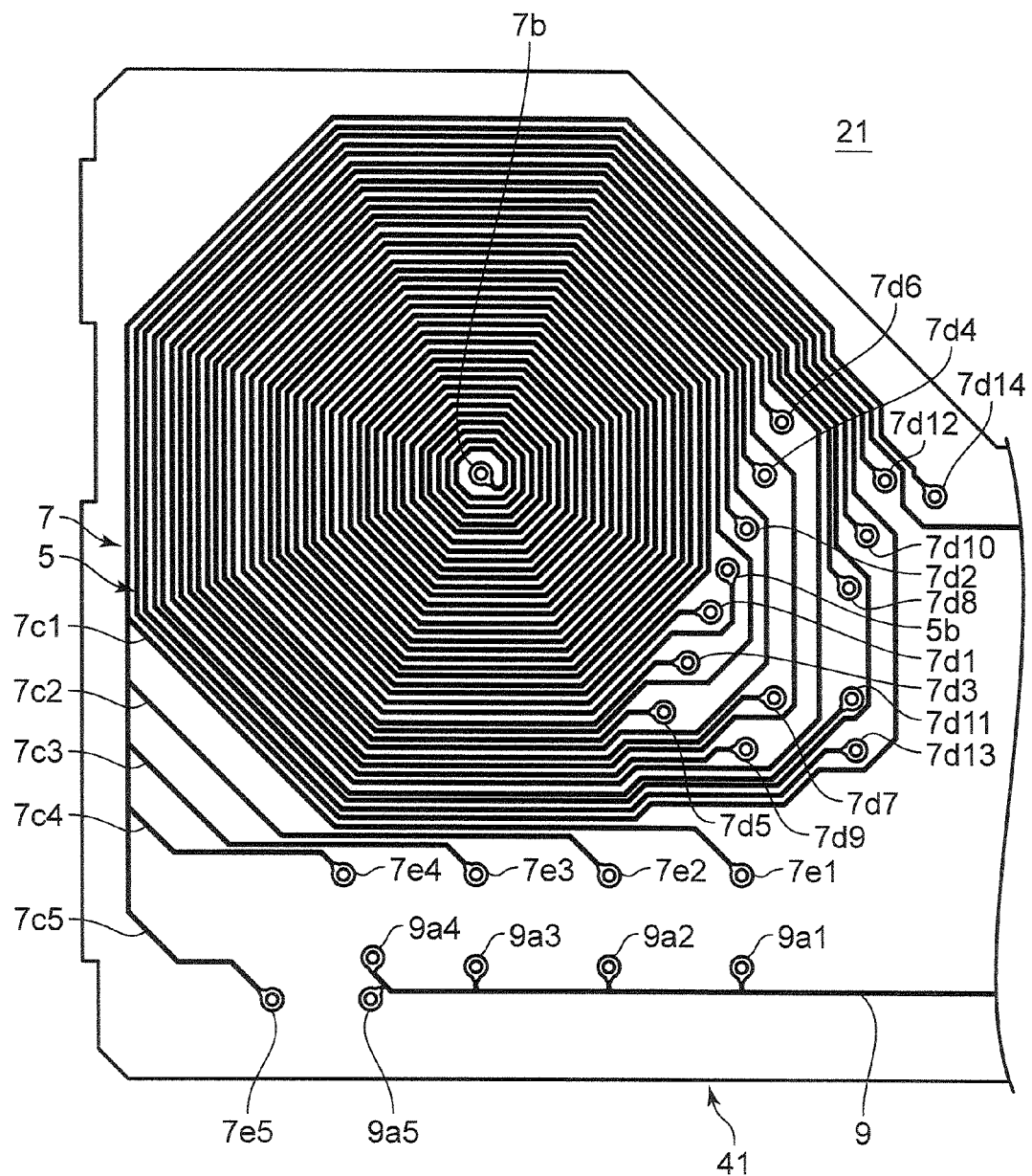
FIG. 10 is a plan view showing a layout example of a second drive coil and a second differential coil.

FIG. 10 is a plan view showing a layout example of the second drive coil 5 and the second differential coil 7. FIG. 10 shows a state when the second surface 41 is viewed through the substrate 21 from the first surface 31 side shown in FIG. 6. The second drive coil 5 and the differential coil 7 are arranged on the second surface 41 of the substrate 21. Since the second differential coil 7 functions as the detection coil, the second surface 41 can be called a detection coil surface.

Figure 11:
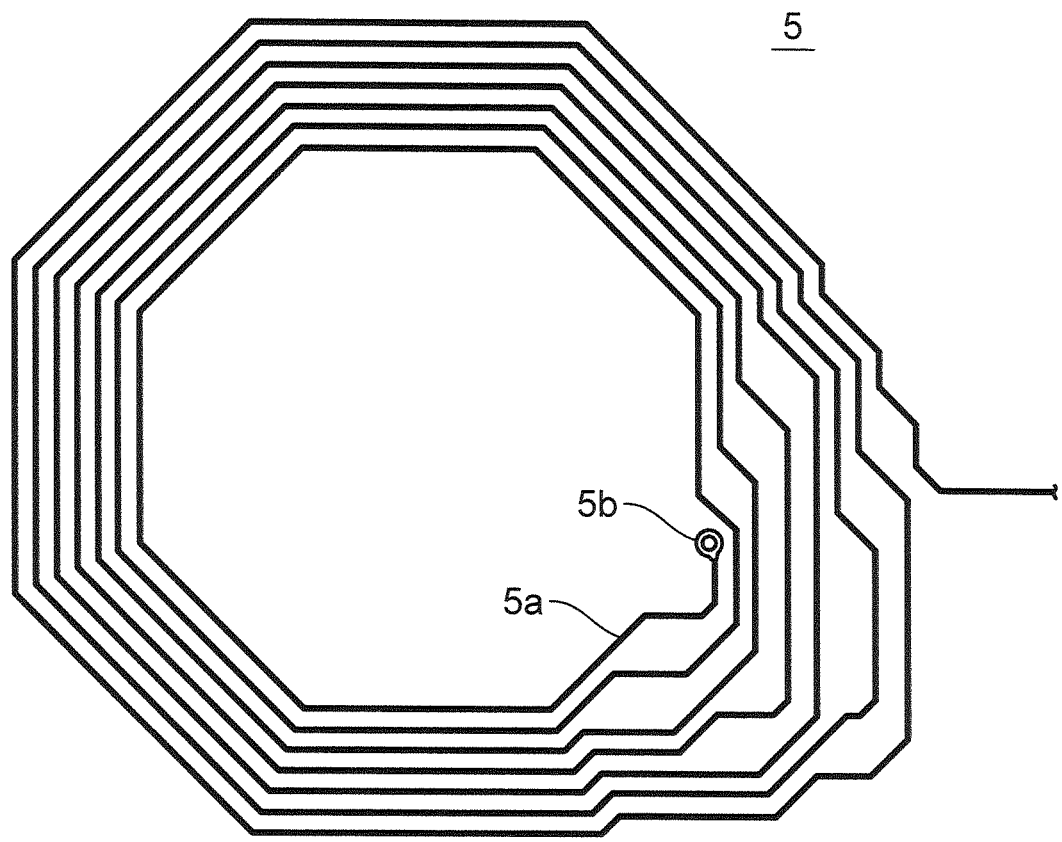
FIG. 11 is a plan view showing a state where the second drive coil is extracted from the second drive coil and the second differential coil shown in FIG. 10.

First, the second drive coil 5 is described. FIG. 11 is a plan view showing a state where the second drive coil 5 is extracted from the second drive coil 5 and the second differential coil 7 shown in FIG. 10. With reference to FIGS. 5 and 11, the second drive coil 5 includes a planar coil wound in a direction opposite to the first drive coil 4 (FIG. 7) when viewed from the first surface 31 side and arranged in the second outer area 43. Specifically, the second drive coil 5 is made of a wire material 5a wound in an octagonal shape, and the wire member 5a is so patterned that the octagonal shape becomes gradually larger in a clockwise direction from a terminal 5b as a start end.

Figure 13:
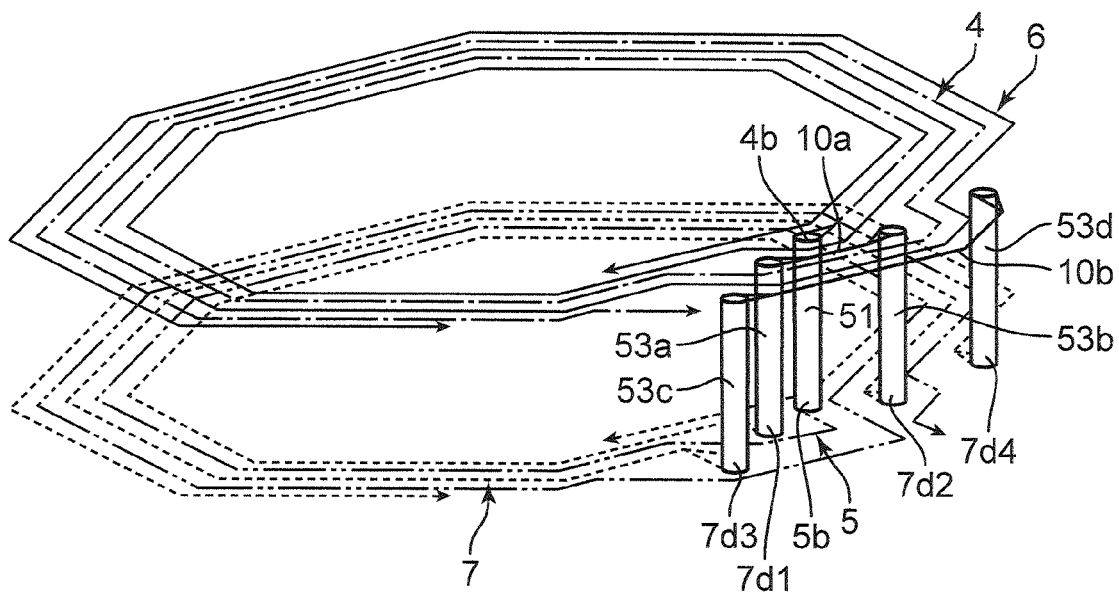
FIG. 13 is a perspective view showing coils arranged in a first outer area and a second outer area.

The second drive coil 5 is connected to the first drive coil 4. This is described with reference to FIG. 13. FIG. 13 is a perspective view showing the coils arranged in the first outer area 33 and the second outer area 43. A first connecting member 51 is electrically conductive and embedded in a through hole (not shown) formed in the substrate 21. The terminal 4b as one end of the first drive coil 4 and the terminal 5b as one end of the second drive coil 5 are connected by the first connecting member 51.

Figure 12:
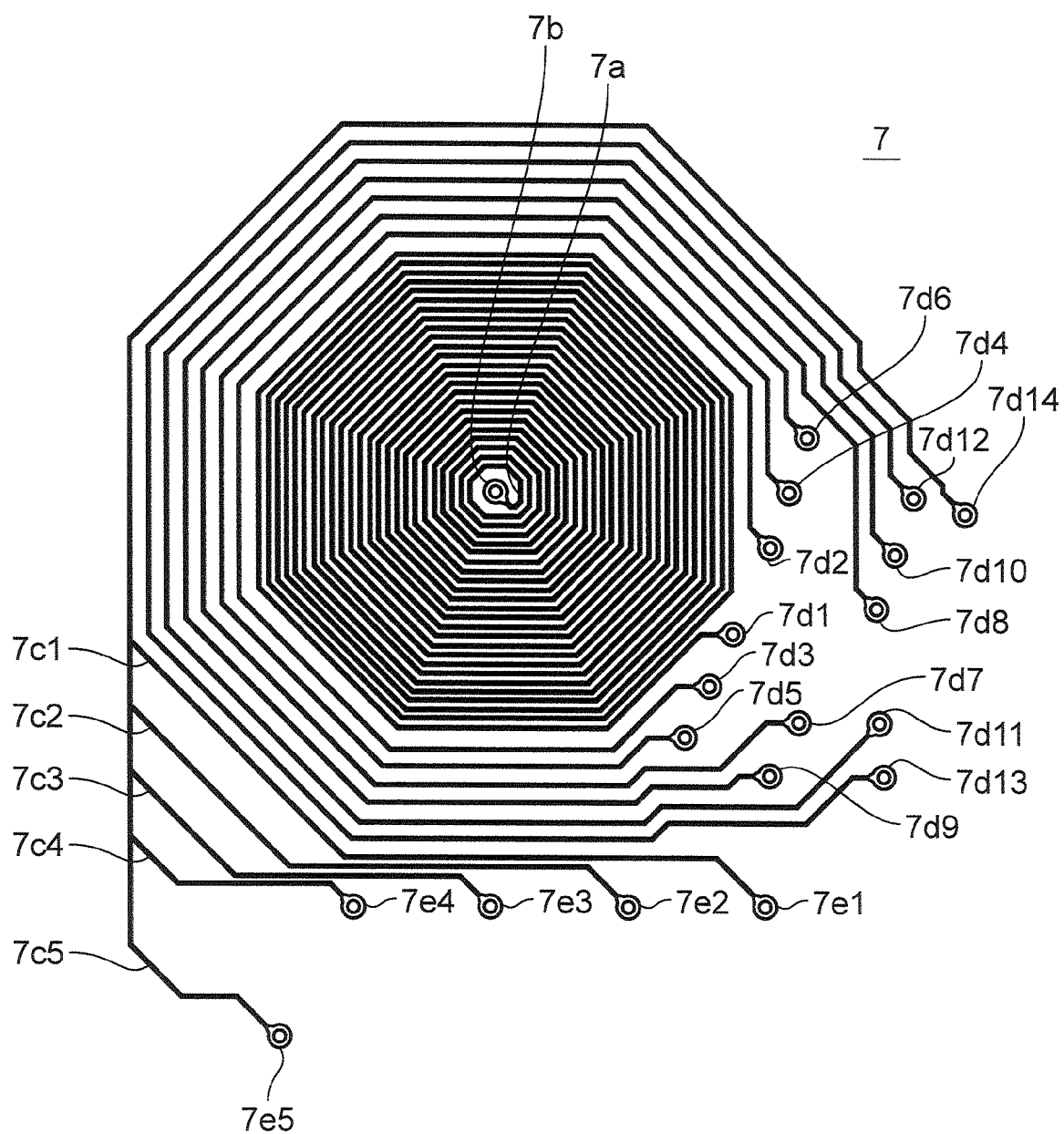
FIG. 12 is a plan view showing a state where the second differential coil is extracted from the second drive coil and the second differential coil shown in FIG. 10.

Next, the second differential coil 7 is described. FIG. 12 is a plan view showing a state where the second differential coil 7 is extracted from the second drive coil 5 and the second differential coil 7 shown in FIG. 10. With reference to FIGS. 5 and 12, the second differential coil 7 includes a planar coil wound in a direction opposite to the second drive coil 5 (FIG. 11) and arranged in the second inner area 42 and the second outer area 43. Specifically, the second differential coil 7 is made of a wire material 7a wound in an octagonal shape, and the wire member 7a is so patterned that the octagonal shape becomes gradually larger in the counterclockwise direction from a terminal 7b as a start end.

Figure 14:
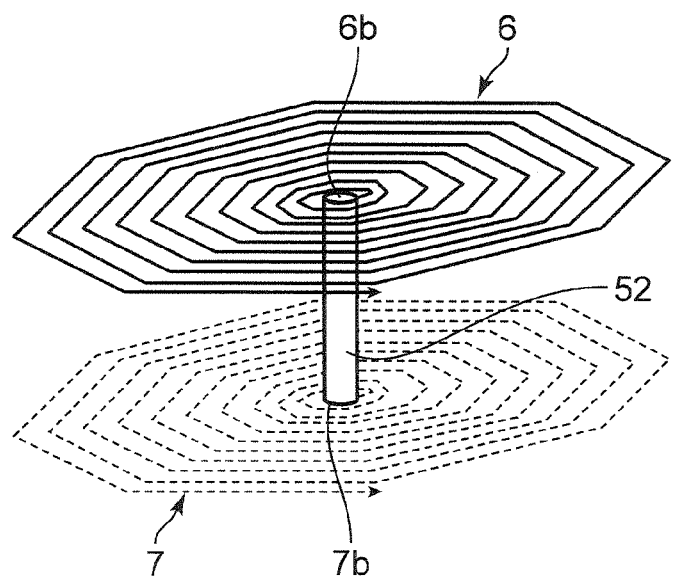
FIG. 14 is a perspective view showing coils arranged in a first inner area and a second inner area.

The second differential coil 7 is connected to the first differential coil 6. This is described with reference to FIG. 14. FIG. 14 is a perspective view showing the coils arranged in the first inner area 32 and the second inner area 42. A second connecting member 52 is electrically conductive and embedded in a through hole (not shown) formed in the substrate 21. The terminal 6b as one end of the first differential coil 6 and the terminal 7b as one end of the second differential coil 7 are connected by the second connecting member 52.

With reference to FIG. 12, the second differential coil includes five (an example of plural) second branch lines 7c1, 7c2, 7c3, 7c4 and 7c5 formed by branching the wire member forming the outermost turn of the second drive coil 7. The second branch lines 7c1 to 7c5 are written as second branch lines 7c in some cases unless it is necessary to distinguish the second branch lines 7c1 to 7c5. The five second branch lines 7c are so arranged that the amounts of magnetic fluxes passing along the respective second branch lines 7c differ when the second drive coil 5 is driven. The second branch lines 7c are described in detail later.

With reference to FIGS. 6 and 10, the width of the wire material of the first drive coil 4, that of the wire material of the second drive coil 5, that of the wire material of the first differential coil 6, that of the wire material of the second differential coil 7 and those of the respective connection patterns 10a to 10g are, for example, 0.15 mm. An interval between the adjacent wire materials is, for example, 0.15 mm. External dimensions of the first and second differential coils 6, 7 are, for example, 24.0 mm. External dimensions of the first and second drive coils 4, 5 are, for example, 23.4 mm.

To improve measurement accuracy of the magnetic sensor 3, the differential voltage V0 needs to be largely changed in an output range (e.g. 0.2 to 3.3 V) of the differential voltage V0. To this end, the electromotive force V1 generated by the first differential coil 6 and the electromotive force V2 generated by the second differential coil 7 are preferably balanced in a state where no magnetic substance is present near the magnetic sensor 3. The following arrangement is made to balance the electromotive forces V1 and V2. A turn number of the first differential coil 6 and that of the second differential coil 7 are made equal. The first differential coil 6 is arranged on the first surface 31 and the second differential coil 7 is arranged on the second surface 41 such that the pattern of the first differential coil 6 and that of the second differential coil 7 maximally overlap via the substrate 21. Similarly, a turn number of the first drive coil 4 and that of the second drive coil 5 are made equal (e.g. a turn number of 7). The first drive coil 4 is arranged on the first surface 31 and the second drive coil 5 is arranged on the second surface 41 such that the pattern of the first drive coil 4 and that of the second drive coil 5 maximally overlap via the substrate 21.

With reference to FIGS. 5 and 10, the wire material forming the second differential coil 7 and that forming the second drive coil 5 are alternately arranged in the second outer area 43. The second drive coil 5 is wound clockwise with the terminal 5b as the start end. The second differential coil 7 is wound counterclockwise with the terminal 7b as the start end. Since the second differential coil 7 is wound in a direction opposite to the second drive coil 5, the second differential coil 7 and the second drive coil 5 intersect in the second outer area 43. To prevent the contact of the second differential coil 7 and the second drive coil 5, the second differential coil 7 and the second drive coil 5 are sterically intersected using the connection patterns 10*a* to 10*g* shown in FIG. 9. This steric intersection is described.

With reference to FIG. 12, the second differential coil 7 is wound counterclockwise with the terminal 7*b* as the start end and reaches a terminal 7*d*1. The second outer area 43 starts from the terminal 7*d*1. The second differential coil 7 has a pattern in which a part of the wire material is missing in each turn of the second differential coil 7 in the second outer area 43. In this pattern, the first turn of the second differential coil 7 starts at a terminal 7*d*2 and ends at a terminal 7*d*3, the second turn of the second differential coil 7 starts at a terminal 7*d*4 and ends at a terminal 7*d*5, the third turn of the second differential coil 7 starts at a terminal 7*d*6 and ends at a terminal 7*d*7, the fourth turn of the second differential coil 7 starts at a terminal 7*d*8 and ends at a terminal 7*d*9, the fifth turn of the second differential coil 7 starts at a terminal 7*d*10 and ends at a terminal 7*d*11, the sixth turn of the second differential coil 7 starts at a terminal 7*d*12 and ends at a terminal 7*d*13 and the seventh turn of the second differential coil 7 starts at a terminal 7*d*14 and reaches the five second branch lines 7*c*.

With reference to FIGS. 9 and 10, the terminals 7*d*1 and 7*d*2 are connected to the connection pattern 10*a*. The terminals 7*d*3 and 7*d*4 are connected to the connection pattern 10*b*. The terminals 7*d*5 and 7*d*6 are connected to the connection pattern 10*c*. The terminals 7*d*7 and 7*d*8 are connected to the connection pattern 10*d*. The terminals 7*d*9 and 7*d*10 are connected to the connection pattern 10*e*. The terminals 7*d*11 and 7*d*12 are connected to the connection pattern 10*f*. The terminals 7*d*13 and 7*d*14 are connected to the connection pattern 10*g*. The connection patterns 10*a* to 10*g* constitute parts of the second differential coil 7. The connection patterns 10*a* to 10*g* are arranged in the second outer area 33 at positions where they sterically intersect with the wire material forming the second drive coil 5.

Third connecting members are used to connect these pairs of terminals (e.g. terminals 7*d*1 and 7*d*2) and the connection patterns 10*a* to 10*g*. With reference to FIG. 13, the third connecting members 53*a*, 53*b*, 53*c* and 53*d* are electrically conductive and embedded in through holes (not shown) formed in the substrate 21. The terminal 7*d*1 and one end of the connection pattern 10*a* are connected by the third connecting member 53*a*. The other end of the connection pattern 10*a* and the terminal 7*d*2 are connected by the third connecting member 53*b*. The terminal 7*d*3 and one end of the connection pattern 10*b* are connected by the third connecting member 53*c*. The other end of the connection pattern 10*b* and the terminal 7*d*4 are connected by the third connecting member 53*d*. Although not shown, the remaining terminals 7*d*5 to 7*d*14 and the remaining connection patterns 10*c* to 10*g* are connected in a similar manner. The above is the description of the steric intersection of the second differential coil 7 and the second drive coil 5.

As described above, the five first branch lines 6*c* shown in FIG. 6 are so arranged that the amounts of magnetic fluxes passing along the respective first branch lines 6*c* differ when the first drive coil 4 is driven. The five second branch lines 7*c* shown in FIG. 10 are so arranged that the amounts of magnetic fluxes passing along the respective second branch lines 7*c* differ when the second drive coil 5 is driven. Since the first branch lines 6*c* and the second branch lines 7*c* are arranged in the same way, description is made using the first branch lines 6*c*.

With reference to FIGS. 6 and 8, the first differential coil 6 and the first drive coil 4 are wound in the octagonal shape. The first branch lines 6*c*1, 6*c*2 and 6*c*3 are arranged along two consecutive sides of the octagonal shape on the outermost turn of the first drive coil 4. The first branch lines 6*c*4 and 6*c*5 are arranged along the first one of the above two sides. The first branch line 6*c*2 is arranged at the outer side of the first branch line 6*c*1, the first branch line 6*c*3 is arranged at the outer side of the first branch line 6*c*2, the first branch line 6*c*4 is arranged at the outer side of the first branch line 6*c*3, and the first branch line 6*c*5 is arranged at the outer side of the first branch line 6*c*4. Lengths of the five first branch lines 6*c* differ from each other, wherein the first branch line 6*c*1 is longest, the first branch line 6*c*2 is second longest, the first branch line 6*c*3 is third longest, the first branch line 6*c*4 is fourth longest and the first branch line 6*c*5 is shortest.

A distance between the adjacent first branch lines 6*c* along the first one of the above two sides is longer than a distance between adjacent parts of the wire material of the first drive coil 6 before the wire material forming the first differential coil 6 is branched off into the five first branch lines 6*c*. For example, a distance d between the first branch lines 6*c*1 and 6*c*2 is longer than a distance D between the adjacent parts of the wire material of the first differential coil 6. By making the distance between the adjacent first branch lines 6*c* relatively longer, the amounts of magnetic fluxes passing along the five first branch lines 6*c* can be made largely different when the first drive coil 4 is driven.

When the first drive coil 4 is driven, the amount of magnetic flux passing along the first branch line 6*c* is influenced by the length of a part of the first branch line 6*c* extending along the outermost turn of the first drive coil 4 and a distance between the outermost turn of the first drive coil 4 and the first branch line 6*c*. A small amount of magnetic flux passes along the first branch line 6*c* if the length of the part of the first branch line 6*c* extending along the outermost turn of the first drive coil 4 is short, and a large amount of magnetic flux passes along the first branch line 6*c* if the length of the part of the first branch line 6*c* extending along the outermost turn of the first drive coil 4 is long. Further, a small amount of magnetic flux passes along the first branch line 6*c* if the distance between the outermost turn of the first drive coil 4 and the first branch line 6*c* is long, and a large amount of magnetic flux passes along the first branch line 6*c* if the distance is short.

Figure 15:
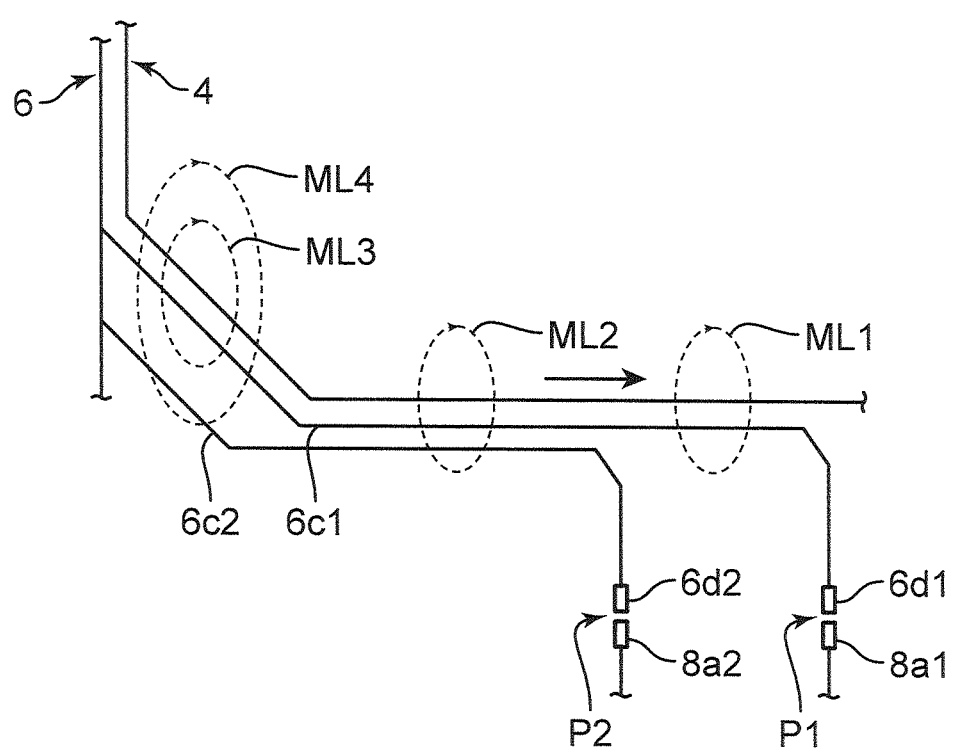
FIG. 15 is a diagram showing an example of a relationship between first branch lines and magnetic field lines.

For example, it is assumed that annular magnetic flux lines ML1, ML2, ML3 and ML4 are generated as shown in FIG. 15 when the first drive coil 4 is driven. The magnetic flux lines ML3 and ML4 form concentric circles. The first branch line 6*c*1 passes through the insides of all the magnetic flux lines ML1 to ML4. However, the first branch line 6*c*2 passes through the insides of the magnetic flux lines ML2, ML4, but does not pass through the insides of the magnetic flux lines ML1, ML3. Thus, the amount of magnetic flux passing along the first branch line 6*c*1 is more than the amount of magnetic flux passing along the first branch line 6*c*2.

Accordingly, when the first drive coil 4 is driven, the following relationship of the amount of magnetic flux holds: amount of magnetic flux passing along the first branch line 6*c*1>amount of magnetic flux passing along the first branch line 6*c*2>amount of magnetic flux passing along the first branch line 6*c*3>amount of magnetic flux passing along the first branch line 6*c*4>amount of magnetic flux passing along the first branch line 6*c*5. For the same reason, when the second drive coil 5 is driven, the following relationship of the amount of magnetic flux holds: amount of magnetic flux passing along the second branch line 7*c*1>amount of magnetic flux passing along the second branch line 7*c*2>amount of magnetic flux passing along the second branch line 7c3>amount of magnetic flux passing along the second branch line 7c4>amount of magnetic flux passing along the second branch line 7c5.

The first branch line 6c1 and the second branch line 7c1 have substantially the same length and are facing each other. Similarly, the first branch line 6c2 and the second branch line 7c2 have substantially the same length and are facing each other. The first branch line 6c3 and the second branch line 7c3 have substantially the same length and are facing each other. The first branch line 6c4 and the second branch line 7c4 have substantially the same length and are facing each other. The first branch line 6c5 and the second branch line 7c5 have substantially the same length and are facing each other.

The first branch lines 6c and the second branch lines 7c are used for the zero adjustment of the differential transformer of the magnetic sensor 3. This is described with reference to FIGS. 6 and 10. As described above, the second drive coil 5 and the second differential coil 7 are sterically intersected so that the wire material forming the second drive coil 5 and that forming the second differential coil 7 do not come into contact. Thus, the pattern of the second differential coil 7 arranged in the second outer area 43 cannot be made symmetrical with the pattern of the first differential coil 6 arranged in the first outer area 33. As a result, the electromotive force V1 generated in the first differential coil 6 and the electromotive force V2 generated in the second differential coil 7 differ.

The first branch line 6c1 and the second branch line 7c1 are set as references. If the electromotive force V1 generated in the first differential coil 6 is larger than the electromotive force V2 generated in the second differential coil 7 in a state where no magnetic substance (e.g. magnetic toner) is present near the magnetic sensor 3, any one of the first branch lines 6c2 to 6c5 is selected instead of the first branch line 6c1 to make the electromagnetic force V1 smaller. The first branch line 6c5 can make the electromagnetic force V1 smallest, then the first branch line 6c4, then the first branch line 6c3 and then the first branch line 6c2.

On the other hand, if the electromotive force V1 is smaller than the electromotive force V2 in a state where no magnetic substance e.g. magnetic toner is present near the magnetic sensor 3, any one of the second branch lines 7c2 to 7c5 is selected instead of the second branch line 7c1 to make the electromagnetic force V2 smaller. The second branch line 7c5 can make the electromagnetic force V2 smallest, then the second branch line 7c4, then the second branch line 7c3 and then the second branch line 7c2.

Next, the first selector unit 15 (FIG. 3) for selecting any one of the five first branch lines 6c is described. With reference to FIG. 6, an end part of the first branch line 6c1 is arranged at the position P1 and functions as the terminal 6d1. An end part of the first branch line 6c2 is arranged at the position P2 and functions as the terminal 6d2. An end part of the first branch line 6c3 is arranged at the position P3 and functions as the terminal 6d3. An end part of the first branch line 6c4 is arranged at the position P4 and functions as the terminal 6d4. An end part of the first branch line 6c5 is arranged at the position P5 and functions as the terminal 6d5.

A first wiring 8 connected to the amplifier circuit 12 (FIG. 3) is arranged on the first surface 31. The first wiring 8 is connectable to the five first branch lines 6c. The first wiring 8 includes a terminal 8a1 used for connection to the first branch line 6c1, a terminal 8a2 used for connection to the first branch line 6c2, a terminal 8a3 used for connection to the first branch line 6c3, a terminal 8a4 used for connection to the first branch line 6c4 and a terminal 8a5 used for connection to the first branch line 6c5.

Figure 16:
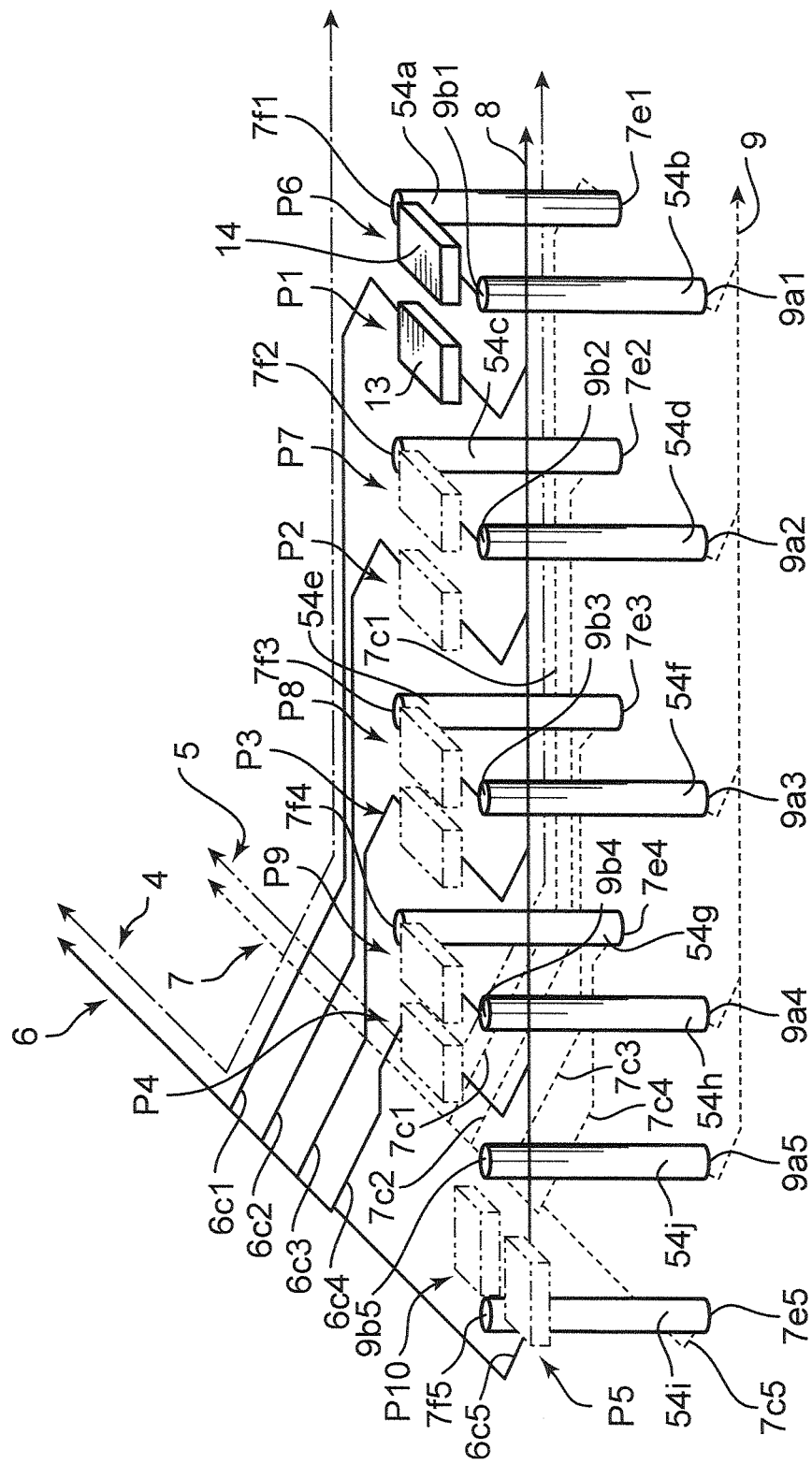
FIG. 16 is a perspective view showing the substrate near a selector unit area shown in FIG. 4.

Any one of the five first branch lines 6c is connected to the first wiring 8 via the resistor 13 described with reference to FIG. 3. This is described using FIGS. 6 and 16. FIG. 16 is a perspective view showing the substrate 21 near the selector unit area 34 shown in FIG. 4. For example, if the resistor 13 is arranged at the position P1 to connect the terminals 6d1 and 8a1, the first branch line 6c1 is connected to the first wiring 8. That is, the first branch line 6c1 can be selected. The first selector unit 15 is formed by the terminals 6d1, 8a1 at the position P1, the terminals 6d2, 8a2 at the position P2, the terminals 6d3, 8a3 at the position P3, the terminals 6d4, 8a4 at the position P4, the terminals 6d5, 8a5 at the position P5 and the resistor 13. The first selector unit 15 is used for the zero adjustment of the differential transformer of the magnetic sensor 3 and can select any one of the five first branch lines 6c.

The second selector unit 16 (FIG. 3) for selecting any one of the five second branch lines 7c is described. With reference to FIG. 10, an end part of the second branch line 7c1 functions as a terminal 7e1. An end part of the second branch line 7c2 functions as a terminal 7e2. An end part of the second branch line 7c3 functions as a terminal 7e3. An end part of the second branch line 7c4 functions as a terminal 7e4. An end part of the second branch line 7c5 functions as a terminal 7e5.

A second wiring 9 connected to the amplifier circuit 12 (FIG. 3) is arranged on the second surface 41. The second wiring 9 is connectable to the five second branch lines 7c. The second wiring 9 includes a terminal 9a1 used for connection to the second branch line 7c1, a terminal 9a2 used for connection to the second branch line 7c2, a terminal 9a3 used for connection to the second branch line 7c3, a terminal 9a4 used for connection to the second branch line 7c4 and a terminal 9a5 used for connection to the second branch line 7c5.

The second branch line 7c and the second wiring 9 are connected at any one of the positions P6, P7, P8, P9 and P10 on the first surface 31 shown in FIG. 6. With reference to FIGS. 6 and 16, the position P6 is adjacent to the position P1 and terminals 7f1 and 9b1 are arranged there. The terminal 7f1 and the terminal 7e1 of the second branch line 7c1 are connected by a fourth connecting member 54a. The terminal 9b1 and the terminal 9a1 of the second wiring 9 are connected by a fourth connecting member 54b.

The position P7 is adjacent to the position P2 and terminals 7f2 and 9b2 are arranged there. The terminal 7f2 and the terminal 7e2 of the second branch line 7c2 are connected by a fourth connecting member 54c. The terminal 9b2 and the terminal 9a2 of the second wiring 9 are connected by a fourth connecting member 54d.

The position P8 is adjacent to the position P3 and terminals 7f3 and 9b3 are arranged there. The terminal 7f3 and the terminal 7e3 of the second branch line 7c3 are connected by a fourth connecting member 54e. The terminal 9b3 and the terminal 9a3 of the second wiring 9 are connected by a fourth connecting member 54f.

The position P9 is adjacent to the position P4 and terminals 7f4 and 9b4 are arranged there. The terminal 7f4 and the terminal 7e4 of the second branch line 7c4 are connected by a fourth connecting member 54g. The terminal 9b4 and the terminal 9a4 of the second wiring 9 are connected by a fourth connecting member 54h.

The position P10 is adjacent to the position P5 and terminals 7f5 and 9b5 are arranged there. The terminal 7f5 and the terminal 7e5 of the second branch line 7c5 are connected by a fourth connecting member 54i. The terminal 9b5 and the terminal 9a5 of the second wiring 9 are connected by a fourth connecting member 54j.

The fourth connecting members 54a to 54j are embedded in through holes (not shown) formed in the substrate 21.

Any one of the five second branch lines 7c is connected to the second wiring 9 via the capacitor 14 described with reference to FIG. 3. With reference to FIG. 16, for example, if the capacitor 14 is arranged at the position P6 to connect the terminals 7f1 and 9b1, the second branch line 7c1 is connected to the second wiring 9. The second selector unit 16 is formed by the terminals 7f1, 9b1 at the position P6, the terminals 7f2, 9b2 at the position P7, the terminals 7f3, 9b3 at the position P8, the terminals 7f4, 9b4 at the position P9, the terminals 7f5, 9b5 at the position P10 and the capacitor 14. The second selector unit 16 is used for the zero adjustment of the differential transformer of the magnetic sensor 3 and can select any one of the five second branch lines 7c.

Main effects of this embodiment are described.

With reference to FIGS. 7, 8, 11 and 12, the first drive coil 4 and the first differential coil 6 are wound in the same direction and the second drive coil 5 and the second differential coil 7 are wound in the opposite directions in the differential transformer including the first drive coil 4, the first differential coil 6, the second drive coil 5 and the second differential coil 7. Since the wire material forming the first drive coil 4 and that forming the first differential coil 6 are alternately arranged in the first outer area 33 (FIG. 4) in this embodiment, magnetic coupling between these coils can be increased. Further, since the wire material forming the second drive coil 5 and that forming the second differential coil 7 are alternately arranged in the second outer area 43 (FIG. 5), magnetic coupling between these coils can be increased.

Since the second drive coil 5 and the second differential coil 7 are wound in the opposite directions, the intersection of the wire material forming the second drive coil 5 and that forming the second differential coil 7 is unavoidable. If the second drive coil 5 and the second differential coil 7 come into contact, a short circuit occurs between these coils. Accordingly, in this embodiment, the wire material forming the second drive coil 5 and that forming the differential coil 7 are sterically intersected using the connection patterns 10a to 10g (FIG. 9) and the third connecting members (third connecting members 53a 53b connected with the connection pattern 10a and third connecting members 53c, 53d connected with the connection pattern 10b are shown in FIG. 13). This prevents the contact of the second drive coil 5 and the second differential coil 7 while causing the wire material forming the second drive coil 5 and that forming the second differential coil 7 to intersect.

In this embodiment, as shown in FIGS. 6 and 10, the first drive coil 4 and the first differential coil 6 are arranged on the first surface 31 of the substrate 21 and the second drive coil 5 and the second differential coil 7 are arranged on the second surface 41 on the side opposite to the first surface 31. Since the first drive coil 4, the first differential coil 6, the second drive coil 5 and the second differential coil 7 are arranged on one substrate 21 in this way, the magnetic sensor 3 can be miniaturized.

As described above, according to this embodiment, magnetic coupling between the first drive coil 4 and the first differential coil 6 and that between the second drive coil 5 and the second differential coil 7 can be increased and the magnetic sensor 3 can be miniaturized. This can realize a highly accurate differential transformer type magnetic sensor while realizing a configuration that the planar coils arranged on the substrate 21 are formed by the drive coils (first drive coil 4, second drive coil 5) and the differential coils (first differential coil 6, second differential coil 7). Further, since the first drive coil 4, the first differential coil 6, the second drive coil 5 and the second differential coil 7 are arranged not on a plurality of layers of substrates, but on one layer of the substrate 21, the cost of the magnetic sensor 3 can be reduced.

Note that the steric intersection is realized by constituting parts of the second differential coil 7 by the connection patterns 10a to 10g (FIG. 9) in this embodiment. Taking the connection pattern 10a as an example, the wire material forming the second differential coil 7 and that forming the second drive coil 5 are sterically intersected by connecting the connection pattern 10a to the wire material forming the second differential coil 7 (dotted line) by the third connecting members 53a, 53b as shown in FIG. 13. However, the steric intersection may be realized by constituting parts of the second drive coil 5 (chain double-dashed line) by the connection patterns 10a to 10g. Specifically, taking the connection pattern 10a as an example, the wire material forming the second differential coil 7 and that forming the second drive coil 5 are sterically intersected by connecting the connection pattern 10a to the wire material forming the second drive coil 5 by the third connecting members 53a, 53b.

Although the first differential coil 6 is the reference coil and the second differential coil 7 is the detection coil in this embodiment, the first differential coil 6 may be the detection coil and the second differential coil 7 may be the reference coil.

According to this embodiment, as shown in FIG. 6, the five first branch lines 6c1 to 6c5 are so arranged that the amounts of magnetic fluxes passing along the respective first branch lines 6c1 to 6c5 differ when the first drive coil 4 is driven. Thus, the magnitude of the electromagnetic force V1 generated in the first differential coil 6 can be adjusted by selecting any one of the five first branch lines 6c1 to 6c5 by the first selector unit 15 (FIG. 3). Similarly, as shown in FIG. 10, the five second branch lines 7c1 to 7c5 are so arranged that the amounts of magnetic fluxes passing along the respective second branch lines 7c1 to 7c5 differ when the second drive coil 5 is driven. Thus, the magnitude of the electromagnetic force V2 generated in the second differential coil 7 can be adjusted by selecting any one of the five second branch lines 7c1 to 7c5 by the second selector unit 16 (FIG. 3). By the above, according to this embodiment, the zero adjustment of the differential transformer of the magnetic sensor 3 can be made on the substrate 21 when the planar coils arranged on the substrate 21 are formed by the drive coils and the differential coils. This can realize a highly accurate differential transformer type magnetic sensor while realizing the configuration that the planar coils arranged on the substrate 21 are formed by the drive coils (first drive coil 4, second drive coil 5) and the differential coils (first differential coil 6, second differential coil 7).

Although both the first selector unit 15 and the second selector unit 16 are provided in this embodiment, only either one of the first and second selector units 15, 16 may be provided. This is described, taking the first selector unit 15 as an example. The second branch lines 7c1 to 7c5 shown in FIG. 10 are assumed to be one second branch line 7c3. The first branch line 6c3 shown in FIG. 6 is set as a reference. If the electromagnetic force V1 generated in the first differential coil 6 is larger than the electromagnetic force V2 generated in the second differential coil 7, either one of the first branch lines 6c4 and 6c5 is selected instead of the first branch line 6c3 to make the electromagnetic force V1 smaller. Contrary to this, if the electromagnetic force V1 is smaller than the electromagnetic force V2, either one of the first branch lines 6c1 and 6c2 is selected instead of the first branch line 6c3 to make the electromagnetic force V1 larger.

With reference to FIG. 16, according to this embodiment, the resistor 13 used to set an amplification factor at which the differential voltage V0 is amplified in the amplifier circuit 12 is used as a connecting member for connection between any one of the five first branch lines 6c1 to 6c5 and the first wiring 8. The capacitor 14 for cutting a direct-current component of the differential voltage V0 is used as a connecting member for connection between any one of the five second branch lines 7c1 to 7c5 and the second wiring 9. Accordingly, it is not necessary to provide these connecting members anew. Note that the capacitor 14 may be used as the connecting member for connection between any one of the five first branch lines 6c1 to 6c5 and the first wiring and the resistor 13 may be used as the connecting member for connection between any one of the five second branch lines 7c1 to 7c5 and the second wiring 9. Further, zero ohm resistors mountable on the surface of the substrate 21 can be used instead of the resistor 13 and the capacitor 14. Further, mechanical or electronic switches can also be used instead of the resistor 13, the capacitor 14 or the zero ohm resistors. In this case, any one of the five first branch lines 6c1 to 6c5 and the first wiring 8 can be made connectable by a first switch and any one of the five second branch lines 7c1 to 7c5 and the second wiring 9 can be made connectable by a second switch.

With reference to FIGS. 4 and 5, according to this embodiment, the first and second selector units 15, 16 are arranged on the first surface 31 on which the first differential coil 6 (reference coil) is arranged. Thus, no projections such as the first and second selector units 15, 16 are arranged on the second surface 41 (detection coil surface) on which the second differential coil 7 (detection coil) is arranged, wherefore a distance between the second surface 41 and the magnetic substance can be shortened. Hence, a highly accurate differential transformer type magnetic sensor can be realized.

Note that if a combination of the first branch line and the second branch line used for the zero adjustment out of the five first branch lines 6c1 to 6c5 and the five second branch lines 7c1 to 7c5 is already known, unnecessary branch lines may be omitted. For example, if it is already known that the zero adjustment can be made by a combination of the first branch line 6c2 and the second branch line 7c5, the first branch lines 6c1, 6c3 to 6c5 and the second branch lines 7c1 to 7c4 may not be provided. This configuration can be so expressed that an arrangement is made such that the amount of magnetic flux passing along the wire material (first branch line 6c2) forming the outermost turn of the first differential coil 6 and the amount of magnetic flux passing along the wire material (second branch line 7c5) forming the outermost turn of the second differential coil 7 differ.

With reference to FIGS. 4 and 5, in this embodiment, the first differential coil 6 is arranged in the first inner and outer areas 32, 33 and the second differential coil 7 is arranged in the second inner and outer areas 42, 43. However, the first differential coil 6 may not be necessarily in the first inner area if there is no problem in the sensitivity of the first differential coil 6. Similarly, the second differential coil 7 may not be necessarily in the second inner area 42 if there is no problem in the sensitivity of the first differential coil 7.

Figure 17:
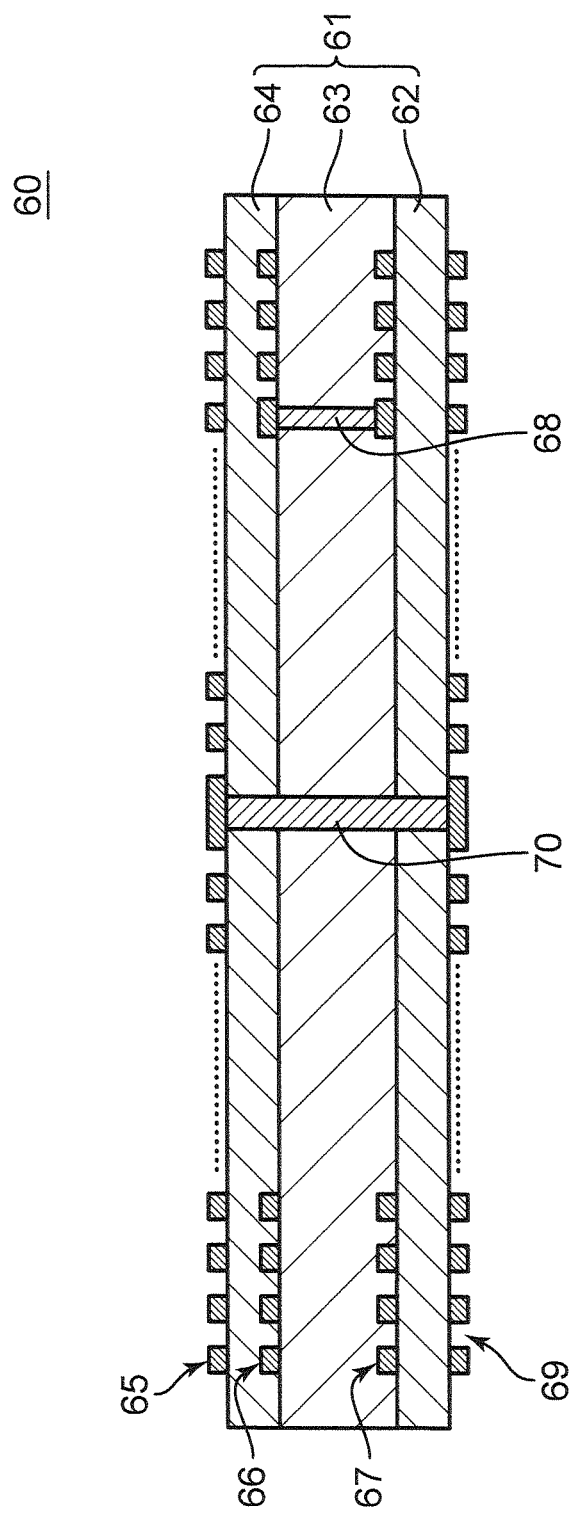
FIG. 17 is a sectional view of a substrate formed with a differential transformer type magnetic sensor according to a modification of the embodiment.

Although this embodiment is described, taking the substrate 21 including one insulating layer as an example, the present disclosure can be applied also to a substrate including a plurality of insulating layers. This is described as a modification of this embodiment. FIG. 17 is a sectional view of a substrate 61 formed with a differential transformer type magnetic sensor 60 according to the modification of the present disclosure. The substrate 61 includes three insulating layers, i.e. an insulating layer 62, an insulating layer 63 located below the insulating layer 62 and an insulating layer 64 located above the insulating layer 62.

A first differential coil 65 in the form of a planar coil is arranged on the upper surface of the insulating layer 64. The first differential coil 65 includes a plurality of first branch lines formed by branching a wire material forming the outermost turn of the first differential coil 65 similarly to the first differential coil 6 shown in FIG. 8.

A first drive coil 66 in the form of a planar coil is arranged between the lower surface of the insulating layer 64 and the upper surface of the insulating layer 63. A second drive coil in the form of a planar coil is arranged between the lower surface of the insulating layer 63 and the upper surface of the insulating layer 62. One end of the first drive coil 66 and one end of the second drive coil 67 are connected using a connecting member 68 so that a magnetic flux generated in the first drive coil 66 and that generated in the second drive coil 67 flow in the same direction when a high-frequency current flows in the first and second drive coils 66, 67. The connecting member 68 is embedded in a through hole formed in the insulating layer 63.

A second differential coil 69 in the form of a planar coil is arranged on the lower surface of the insulating layer 62. The second differential coil 69 includes a plurality of second branch lines formed by branching a wire material forming the outermost turn of the second differential coil 69 similarly to the second differential coil 7 shown in FIG. 12.

One end of the first differential coil 65 and one end of the second differential coil 69 are connected using a connecting member 70 so that a magnetic flux generated in the first differential coil 65 and that generated in the second differential coil 69 flow in opposite directions when an induction current flows in the first and second differential coils 65, 69. The connecting member 70 is embedded in a through hole penetrating through the insulating layers 62, 63 and 64.

A first selector unit 15 (FIG. 3) used for a zero adjustment of a differential transformer and capable of selecting any one of the plurality of first branch lines is arranged on the upper surface of the insulating layer 64. A second selector unit (FIG. 3) used for the zero adjustment of the differential transformer and capable of selecting any one of the plurality of second branch lines is arranged on the lower surface of the insulating layer 62. Note that the second selector unit 16 may be arranged on the upper surface of the insulating layer 64.

In this embodiment, the first drive coil 4 corresponds to the first differential coil 6 and the second drive coil 5 corresponds to the second differential coil 7. However, the drive coil and the differential coil may not correspond one-to-one. For example, in the case of two insulating layers, a first differential coil may be arranged on the upper surface of a first insulating layer, a drive coil may be arranged between the lower surface of the first insulating layer and the upper surface of a second insulating layer, and a second differential coil may be arranged on the lower surface of the second insulating layer.

Although the differential transformer type magnetic sensor 3 is exemplarily described as the sensor for detecting the toner/carrier mixing ratio (toner remaining amount in the one-component development method) of the image forming apparatus 1 in the above embodiment and its modification, the use of the differential transformer type magnetic sensor according to the present disclosure is not limited to these.

Although the present disclosure has been fully described by way of example with reference to the accompanying drawings, it is to be understood that various changes and modifications will be apparent to those skilled in the art. Therefore, unless otherwise such changes and modifications depart from the scope of the present disclosure hereinafter defined, they should be construed as being included therein.

What is claimed is:

1. A differential transformer type magnetic sensor, comprising:
   a substrate;
   a drive coil including a planar coil arranged on the substrate;
   a first differential coil including a planar coil arranged on the substrate and configured to generate an electromotive force when the drive coil is driven;
   a second differential coil including a planar coil arranged on the substrate, connected to the first differential coil and configured to generate an electromotive force when the drive coil is driven; and
   a first selector unit used for a zero adjustment of a differential transformer formed by the drive coil, the first differential coil and the second differential coil;
   wherein:
   the first differential coil includes a plurality of first branch lines formed by branching a wire material forming the outermost turn of the first differential coil;
   the plurality of first branch lines are so arranged that the amount of magnetic fluxes passing along the plurality of respective first branch lines differ when the drive coil is driven; and
   the first selector unit is capable of selecting any one of the plurality of first branch lines and arranged on the substrate.

2. A differential transformer type magnetic sensor according to claim 1, further comprising a second selector unit used for the zero adjustment of the differential transformer, wherein:
   the second differential coil includes a plurality of second branch lines formed by branching a wire material forming the outermost turn of the second differential coil;
   the plurality of second branch lines are so arranged that the amount of magnetic fluxes passing along the plurality of respective second branch lines differ when the drive coil is driven; and
   the second selector unit is capable of selecting any one of the plurality of second branch lines and arranged on the substrate.

3. A differential transformer type magnetic sensor according to claim 2, wherein:
   lengths of the plurality of first branch lines are different from each other; and
   lengths of the plurality of second branch lines are different from each other.

4. A differential transformer type magnetic sensor according to claim 2, wherein:
   a distance between adjacent ones of the first branch lines is larger than a distance between adjacent parts of a wire material forming the first differential coil before the wire material forming the first differential coil is branched off into the plurality of first branch lines; and
   a distance between adjacent ones of the second branch lines is larger than a distance between adjacent parts of a wire material forming the second differential coil before the wire material forming the second differential coil is branched off into the plurality of second branch lines.

5. A differential transformer type magnetic sensor according to claim 2, further comprising:
   one first wiring connectable to the plurality of first branch lines;
   one second wiring connectable to the plurality of second branch lines;
   an amplifier to which the first and second wirings are connected;
   a resistor used to set an amplification factor at which a differential voltage between the electromotive force generated in the first differential coil and that generated in the second differential coil is amplified in the amplifier; and
   a capacitor for cutting a direct-current component of the differential voltage;
   wherein:
   one of the resistor and the capacitor is used to connect any one of the plurality of first branch lines and the first wiring in the first selector unit, whereby any one of the plurality of first branch lines is selected; and
   the other of the resistor and the capacitor is used to connect any one of the plurality of second branch lines and the second wiring in the second selector unit, whereby any one of the plurality of second branch lines is selected.

6. A differential transformer type magnetic sensor according to claim 2, wherein:
   the substrate has a first surface on which the first differential coil is arranged and a second surface which is located on a side opposite to the first surface and on which the second differential coil is arranged;
   the first differential coil has a function of a reference coil;
   the second differential coil has a function of a detection coil; and
   the first and second selector units are arranged on the first surface.

7. A differential transformer type magnetic sensor, comprising:
   a substrate having a first surface and a second surface located on a side opposite to the first surface;
   a first drive coil including a planar coil arranged on the first surface;
   a first differential coil including a planar coil wound in the same direction as the first drive coil and arranged on the first surface and configured to generate an electromotive force when the first drive coil is driven;
   a second drive coil including a planar coil wound in a direction opposite to the first drive coil when viewed from the first surface side and arranged on the second surface;
   a first connecting member penetrating through the substrate and connecting one end of the first drive coil and one end of the second drive coil;
   a second differential coil including a planar coil wound in a direction opposite to the second drive coil and arranged on the second surface and configured to generate an electromotive force when the second drive coil is driven;
   a second connecting member penetrating through the substrate and connecting one end of the first differential coil and one end of the second differential coil;
   a third connecting member formed to penetrate through the substrate; and
   a connection pattern arranged on the first surface and constituting a part of the second drive coil or a part of the second differential coil;
   a first selector unit used for a zero adjustment of a differential transformer formed by the first drive coil, the second drive coil, the first differential coil and the second differential coil; and
   a second selector unit used for the zero adjustment of the differential transformer;

wherein:
a wire material forming the first drive coil and that forming the first differential coil are alternately arranged on the first surface;
a wire material forming the second drive coil and that forming the second differential coil are alternately arranged on the second surface; and
the connection pattern is connected to the wire material forming the second drive coil or that forming the second differential coil by the third connecting member, whereby the wire material forming the second differential coil and that forming the second drive coil are sterically intersected;
the first differential coil includes a plurality of first branch lines formed by branching a wire material forming the outermost turn of the first differential coil;
the second differential coil includes a plurality of second branch lines formed by branching a wire material forming the outermost turn of the second differential coil;
the plurality of first branch lines are so arranged that the amount of magnetic fluxes passing along the plurality of respective first branch lines differ when the first drive coil is driven;
the plurality of second branch lines are so arranged that the amount of magnetic fluxes passing along the plurality of respective second branch lines differ when the second drive coil is driven;
the first selector unit is capable of selecting any one of the plurality of first branch lines and arranged on the substrate; and
the second selector unit is capable of selecting any one of the plurality of second branch lines and arranged on the substrate.

8. A differential transformer type magnetic sensor according to claim 7, wherein:
lengths of the plurality of first branch lines are different from each other; and
lengths of the plurality of second branch lines are different from each other.

9. A differential transformer type magnetic sensor according to claim 7, wherein:
a distance between adjacent ones of the first branch lines is larger than a distance between adjacent parts of a wire material forming the first differential coil before the wire material forming the first differential coil is branched off into the plurality of first branch lines; and
a distance between adjacent ones of the second branch lines is larger than a distance between adjacent parts of a wire material forming the second differential coil before the wire material forming the second differential coil is branched off into the plurality of second branch lines.

10. A differential transformer type magnetic sensor according to claim 7, further comprising:
one first wiring connectable to the plurality of first branch lines;
one second wiring connectable to the plurality of second branch lines;
an amplifier to which the first and second wirings are connected;
a resistor used to set an amplification factor at which a differential voltage between the electromotive force generated in the first differential coil and that generated in the second differential coil is amplified in the amplifier; and
a capacitor for cutting a direct-current component of the differential voltage;

wherein:
one of the resistor and the capacitor is used to connect any one of the plurality of first branch lines and the first wiring in the first selector unit, whereby any one of the plurality of first branch lines is selected; and
the other of the resistor and the capacitor is used to connect any one of the plurality of second branch lines and the second wiring in the second selector unit, whereby any one of the plurality of second branch lines is selected.

11. A differential transformer type magnetic sensor according to claim 7, wherein:
the first differential coil has a function of a reference coil;
the second differential coil has a function of a detection coil; and
the first and second selector units are arranged on the first surface.

12. A differential transformer type magnetic sensor, comprising:
a substrate having a first surface and a second surface located on a side opposite to the first surface;
a first drive coil including a planar coil arranged on the first surface;
a first differential coil including a planar coil wound in the same direction as the first drive coil and arranged on the first surface and configured to generate an electromotive force when the first drive coil is driven;
a second drive coil including a planar coil wound in a direction opposite to the first drive coil when viewed from the first surface side and arranged on the second surface;
a first connecting member penetrating through the substrate and connecting one end of the first drive coil and one end of the second drive coil;
a second differential coil including a planar coil wound in a direction opposite to the second drive coil and arranged on the second surface and configured to generate an electromotive force when the second drive coil is driven;
a second connecting member penetrating through the substrate and connecting one end of the first differential coil and one end of the second differential coil;
a third connecting member formed to penetrate through the substrate; and
a connection pattern arranged on the first surface and constituting a part of the second drive coil or a part of the second differential coil;
a first selector unit used for a zero adjustment of a differential transformer formed by the first drive coil, the second drive coil, the first differential coil and the second differential coil;
wherein:
a wire material forming the first drive coil and that forming the first differential coil are alternately arranged on the first surface;
a wire material forming the second drive coil and that forming the second differential coil are alternately arranged on the second surface; and
the connection pattern is connected to the wire material forming the second drive coil or that forming the second differential coil by the third connecting member, whereby the wire material forming the second differential coil and that forming the second drive coil are sterically intersected;
the first differential coil includes a plurality of first branch lines formed by branching a wire material forming the outermost turn of the first differential coil;

the plurality of first branch lines are so arranged that the amount of magnetic fluxes passing along the plurality of respective first branch lines differ when the first drive coil is driven; and the first selector unit is capable of selecting any one of the plurality of first branch lines and arranged on the substrate.

13. A differential transformer type magnetic sensor; comprising:

a substrate having a first surface and a second surface located on a side opposite to the first surface;

a first drive coil including a planar coil arranged on the first surface;

a first differential coil including a planar coil wound in the same direction as the first drive coil and arranged on the first surface and configured to generate an electromotive force when the first drive coil is driven;

a second drive coil including a planar coil wound in a direction opposite to the first drive coil when viewed from the first surface side and arranged on the second surface;

a first connecting member penetrating through the substrate and connecting one end of the first drive coil and one end of the second drive coil;

a second differential coil including a planar coil wound in a direction opposite to the second drive coil and arranged on the second surface and configured to generate an electromotive force when the second drive coil is driven;

a second connecting member penetrating through the substrate and connecting one end of the first differential coil and one end of the second differential coil;

a third connecting member formed to penetrate through the substrate; and a connection pattern arranged on the first surface and constituting a part of the second drive coil or a part of the second differential coil;

a second selector unit used for a zero adjustment of a differential transformer formed by the first drive coil, the second drive coil, the first differential coil and the second differential coil;

wherein:

a wire material forming the first drive coil and that forming the first differential coil are alternately arranged on the first surface;

a wire material forming the second drive coil and that forming the second differential coil are alternately arranged on the second surface; and the connection pattern is connected to the wire material forming the second drive coil or that forming the second differential coil by the third connecting member, whereby the wire material forming the second differential coil and that forming the second drive coil are sterically intersected;

the second differential coil includes a plurality of second branch lines formed by branching a wire material forming the outermost turn of the second differential coil;

the plurality of second branch lines are so arranged that the amount of magnetic fluxes passing along the plurality of respective second branch lines differ when the second drive coil is driven; and the second selector unit is capable of selecting any one of the plurality of second branch lines and arranged on the substrate.

* * * * *